(12) United States Patent
Inoue

(10) Patent No.: US 6,477,096 B1
(45) Date of Patent: Nov. 5, 2002

(54) SEMICONDUCTOR MEMORY DEVICE CAPABLE OF DETECTING MEMORY CELL HAVING LITTLE MARGIN

(75) Inventor: Yoshinori Inoue, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/987,275

(22) Filed: Nov. 14, 2001

(30) Foreign Application Priority Data

Jun. 19, 2001 (JP) ........................................ 2001-184868

(51) Int. Cl.$^7$ ................................................. G11C 7/00
(52) U.S. Cl. ........................................ 365/201; 365/207
(58) Field of Search ................................ 365/201, 203, 365/207, 227

(56) References Cited

U.S. PATENT DOCUMENTS

| | | | | |
|---|---|---|---|---|
| 5,463,585 A | * | 10/1995 | Sanada | 365/201 |
| 5,793,685 A | * | 8/1998 | Suma | 365/201 |
| 6,041,002 A | * | 3/2000 | Maejima | 365/201 |
| 6,243,307 B1 | * | 6/2001 | Kawagoe | 365/201 |

* cited by examiner

Primary Examiner—Richard Elms
Assistant Examiner—Anh Phung
(74) Attorney, Agent, or Firm—McDermott, Will & Emery

(57) ABSTRACT

A semiconductor memory device has pads, a source voltage supplying circuit, and a memory cell array. The source voltage supplying circuit includes an output node, a switching circuit, and a node. In a normal operation mode, the switching circuit is turned off, and the source voltage supplying circuit supplies a ground voltage supplied from the pad directly to the memory cell array. In a test mode, the switching circuit is turned on, and the source voltage supplying circuit supplies the ground voltage applied from the pad to the memory cell array via an impedance. As a result, a memory cell having little margin can be easily detected.

17 Claims, 20 Drawing Sheets

F I G. 6
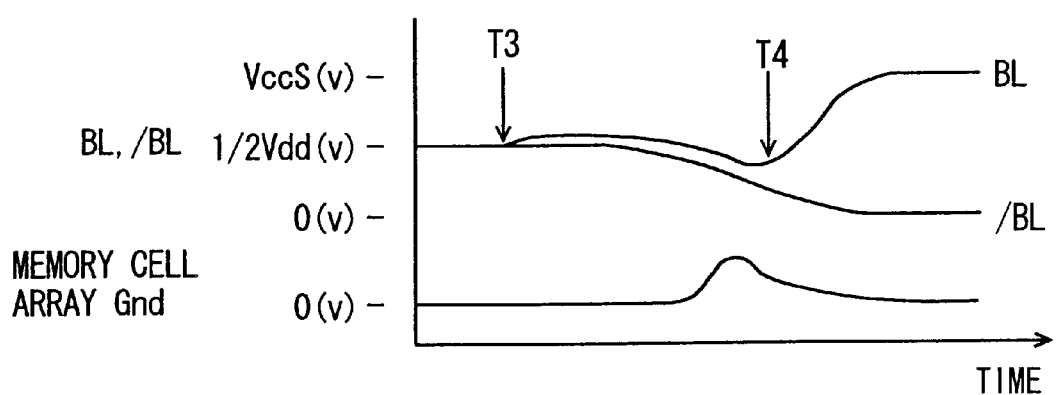

F I G. 8
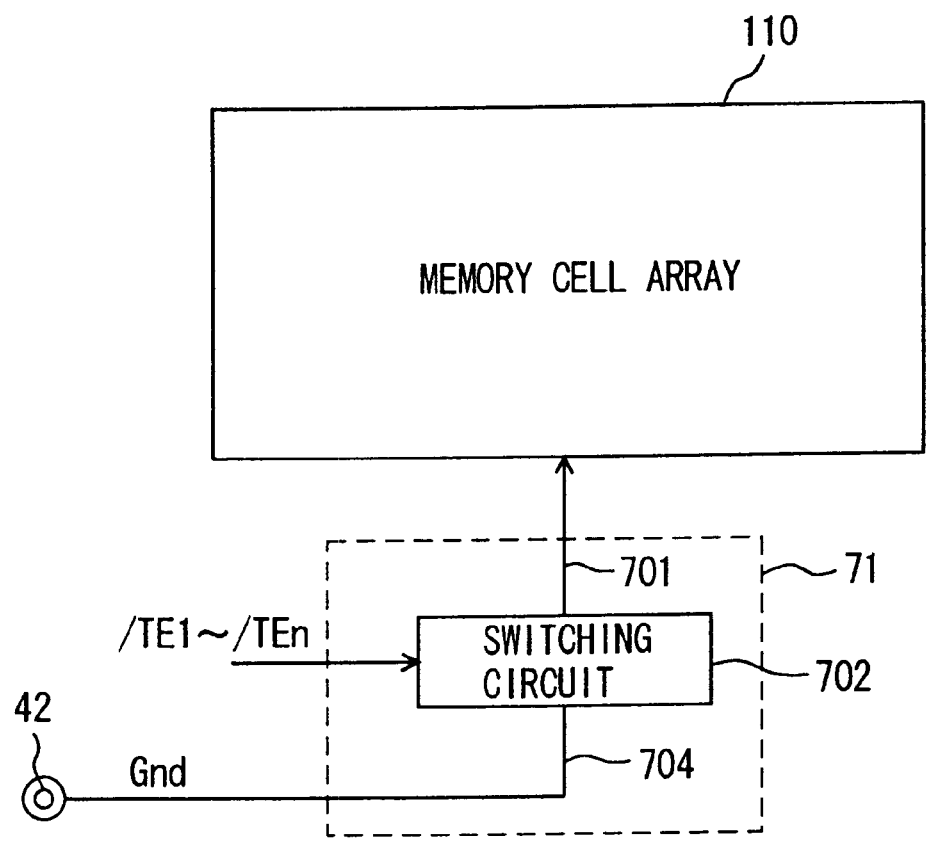

US 6,477,096 B1

SEMICONDUCTOR MEMORY DEVICE CAPABLE OF DETECTING MEMORY CELL HAVING LITTLE MARGIN

BACKGROUND OF THE INVENTION

1. Field of the Invention

The present invention relates to a semiconductor memory device, in particular, to a semiconductor memory device capable of detecting a memory cell having little margin from a plurality of memory cells arranged in a matrix.

2. Description of the Background Art

Attention is being paid to semiconductor memory devices such as a DRAM (Dynamic Random Access Memory) and an SRAM (Static Random Access Memory) as memories capable of inputting/outputting data at high speed.

Referring to FIG. 23, a conventional DRAM 1000 includes a VccS generating circuit 1010, a Vbl generating circuit 1020, a Vcp generating circuit 1030, a memory cell array 1040, and a pad 1050.

VccS generating circuit 1010 drops an external source voltage Vdd supplied from a terminal to thereby generate a memory array voltage VccS, and outputs the generated memory array voltage VccS to memory cell array 1040. Vbl generating circuit 1020 drops external source voltage Vdd supplied from a terminal to thereby generate a precharge voltage Vbl (=Vdd/2) and outputs the generated precharge voltage Vbl to memory cell array 1040.

Vcp generating circuit 1030 drops external source voltage Vdd supplied from a terminal to thereby generate a cell plate voltage Vcp, and outputs the generated cell plate voltage Vcp to memory cell array 1040. Pad 1050 supplies a ground voltage Gnd supplied from a terminal to memory cell array 1040.

Memory array voltage VccS and ground voltage Gnd are supplied to a sense amplifier (not shown) for determining a logic level of data read from a memory cell and amplifying the read data. The sense amplifier amplifies the read data by increasing a voltage on one of a bit line pair BL and /BL to memory array voltage VccS and decreasing a voltage on the other of bit line pair BL and /BL to ground voltage Gnd in response to the logic level of the read data. Specifically, as shown in FIG. 24, before the operation of reading data from memory cells is started, the bit line pair BL and /BL is equalized to precharge voltage Vbl (=Vdd/2) by an equalizing circuit. When reading of data "1" from a memory cell is started at timing T1, a very small potential difference occurs between the bit line pair BL and /BL. In this case, a potential on bit line BL becomes Vdd/2+α, and a potential on bit line /BL remains as precharge voltage Vbl (=Vdd/2).

The potentials (Vdd/2+α and Vdd/2) on bit line pair BL and /BL are transmitted to the sense amplifier. On the basis of the potentials (Vdd/2+α and Vdd/2), the sense amplifier determines the logic level of the read data. The sense amplifier starts amplifying operation at timing T2 to increase the potential on bit line BL to memory array voltage VccS and decrease the potential on bit line /BL to ground voltage Gnd. In this case, during the period from timing T1 to timing T2, ground voltage Gnd supplied to memory cell array 1040 floats. In the case where the data read from a memory cell is "0", the potential on bit line BL and that on bit line /BL are inverse to each other.

In such a manner, the data read from the memory cell is amplified by the sense amplifier. Memory array voltage VccS and ground voltage Gnd are used for the amplification of the read data by the sense amplifier.

Referring again to FIG. 23, precharge voltage Vbl is supplied to the equalizing circuit (not shown) for equalizing the bit line pair BL and /BL. The equalizing circuit equalizes the bit line pair BL and /BL to precharge voltage Vbl (=Vdd/2) before data is read or written. Cell plate voltage Vcp is supplied to one of electrodes (cell plate electrode) of a capacitor for storing data included in a memory cell.

An operation test is conducted on a DRAM before shipment. The operation test is carried out under a condition that a margin of a certain extent is provided to a product standard. For example, when the product standard of source voltage Vdd is 3.3V±0.3, a test is conducted while changing source voltage Vdd in a range from 2.7V to 3.9V or while fluctuating source voltage Vdd from 3.0V to 3.6V in an operative state. A test under combined various timing conditions is also conducted.

Various tests are carried out as described above in order to detect a memory cell having little margin. The "memory cell having little margin" denotes a memory cell which cannot hold data, a memory cell in which a read error occurs, and a memory cell in which a write error occurs. The memory cell having no margin often occurs due to an influence of noise caused in the operation of the DRAM.

In the conventional DRAM, however, since memory array voltage VccS, precharge voltage Vbl, cell plate voltage Vcp, and ground voltage Gnd are supplied from generating circuits and pad for generating the voltages directly to memory cells, a problem such that a number of tests have to be conducted to detect a memory cell having little margin occurs.

SUMMARY OF THE INVENTION

An object of the invention is, therefore, to provide a semiconductor memory device capable of easily detecting a memory cell having little margin.

According to the invention, a semiconductor memory device has: a memory cell array for inputting/outputting data; and a source voltage supplying circuit for supplying an internal source voltage for performing a sensing operation of amplifying read data read from a memory cell included in the memory cell array in response to a logic level of the read data. The memory cell array includes: a plurality of memory cells; a plurality of bit line pairs provided in correspondence with the plurality of memory cells; a plurality of equalizing circuits provided in correspondence with the plurality of bit line pairs, for equalizing the bit line pair to a precharge voltage; and a plurality of sense amplifiers provided in correspondence with the plurality of bit line pairs, for increasing a voltage on one of the bit line pair to a memory array voltage and decreasing a voltage on the other of the bit line pair to a ground voltage in response to the logic level of the read data in the sensing operation. In a normal operation mode, the source voltage supplying circuit supplies the internal source voltage directly to the memory cell array and, in a test mode, the source voltage supplying circuit supplies the internal source voltage to the memory cell array via an impedance.

Preferably, the internal source voltage is a ground voltage, and the source voltage supplying circuit supplies the ground voltage to each of the plurality of sense amplifiers.

Preferably, the semiconductor memory device further includes: a test signal generating circuit for generating a test signal having either a first logic level or a second logic level; and a pad to which the ground voltage is supplied, and the source voltage supplying circuit includes: an output node for supplying the ground voltage to the sense amplifier; and a ground voltage supplying circuit for supplying the ground voltage directly to the output node on receipt of a test signal having the first logic level, and for supplying the ground voltage to the output node via the impedance on receipt of a test signal having the second logic level.

Preferably, the pad includes: a first pad to which the ground voltage is supplied in the normal operation mode; and a second pad to which the ground voltage is supplied in the test mode. The output node is connected to the first pad, the ground voltage supplying circuit includes a plurality of MOS transistors connected in parallel between the output node and the second pad, each of the plurality of MOS transistors is turned off when the test signal having the first logic level is received at its gate terminal and is turned on when the test signal having the second logic level is received at its gate terminal. In the test mode, the test signal generating circuit outputs the test signal having the second logic level to a predetermined number of MOS transistors among the plurality of MOS transistors and outputs the test signal having the first logic level to the rest of MOS transistors.

Preferably, the ground voltage supplying circuit includes a plurality of MOS transistors connected in parallel between the output node and the pad, each of the plurality of MOS transistors is turned off when the test signal having the first logic level is received at its gate terminal and is turned on when the test signal having the second logic level is received at its gate terminal. In the test mode, the test signal generating circuit outputs the test signal having the second logic level to a predetermined number of MOS transistors among the plurality of MOS transistors and outputs the test signal having the first logic level to the rest of MOS transistors. In the normal operation mode, the test signal generating circuit outputs the test signal having the second logic level to the plurality of MOS transistors.

Preferably, the internal source voltage is the memory array voltage, and the source voltage supplying circuit supplies the memory array voltage to each of the plurality of sense amplifiers.

Preferably, the semiconductor memory device further includes a test signal generating circuit for generating a test signal having either a first logic level or a second logic level. The source voltage supplying circuit includes: an output node for supplying the memory array voltage to the sense amplifier; and a voltage supplying circuit for supplying the memory array voltage directly to the output node on receipt of a test signal having the first logic level, and for supplying the memory array voltage to the output node via the impedance on receipt of a test signal having the second logic level.

Preferably, the semiconductor memory device further includes: an internal voltage generating circuit for generating the memory array voltage in the normal operation mode; and a pad to which the memory array voltage is supplied in the test mode. The output node is connected to the internal voltage generating circuit, the voltage supplying circuit includes a plurality of MOS transistors connected in parallel between the output node and the pad, each of the plurality of MOS transistors is turned off when the test signal having the first logic level is received at its gate terminal and is turned on when the test signal having the second logic level is received at its gate terminal. In the test mode, the test signal generating circuit outputs the test signal having the second logic level to a predetermined number of MOS transistors among the plurality of MOS transistors and outputs the test signal having the first logic level to the rest of MOS transistors.

Preferably, the semiconductor memory device further includes an internal voltage generating circuit for generating the memory array voltage. The voltage supplying circuit includes a plurality of MOS transistors connected in parallel between the output node and the internal voltage generating circuit. Each of the plurality of MOS transistors is turned off when the test signal having the first logic level is received at its gate terminal and is turned on when the test signal having the second logic level is received at its gate terminal. In the test mode, the test signal generating circuit outputs the test signal having the second logic level to a predetermined number of MOS transistors among the plurality of MOS transistors and outputs the test signal having the first logic level to the rest of MOS transistors. In the normal operation mode, the test signal generating circuit outputs the test signal having the second logic level to the plurality of MOS transistors.

Preferably, the internal source voltage is the precharge voltage, and the source voltage supplying circuit supplies the precharge voltage to each of the plurality of equalizing circuits.

Preferably, the semiconductor memory device further includes a test signal generating circuit for generating a test signal having either a first logic level or a second logic level. The source voltage supplying circuit includes: an output node for supplying the precharge voltage to the equalizing circuit; and a voltage supplying circuit for supplying the precharge voltage directly to the output node on receipt of a test signal having the first logic level, and for supplying the precharge voltage to the output node via the impedance on receipt of a test signal having the second logic level.

Furthermore, according to the present invention, a semiconductor memory device further includes: an internal voltage generating circuit for generating the precharge voltage in the normal operation mode; and a pad to which the precharge voltage is supplied in the test mode. The output node is connected to the internal voltage generating circuit. The voltage supplying circuit includes: a plurality of MOS transistors of a first conductive type connected in parallel between the output node and the pad; and a plurality of MOS transistors of a second conductive type connected in parallel between the output node and the pad. Each of the plurality of MOS transistors of the first conductive type is turned off when the test signal having the first logic level is received at its gate terminal and is turned on when the test signal having the second logic level is received at its gate terminal. Each of the plurality of MOS transistors of the second conductive type is turned on when the test signal having the first logic level is received at its gate terminal and is turned off when the test signal having the second logic level is received at its gate terminal. In the test mode, the test signal generating circuit outputs the test signal having the second logic level to a predetermined number of MOS transistors among the plurality of MOS transistors of the first conductive type, outputs the test signal having the first logic level to the rest of MOS transistors, outputs the test signal having the first logic level to a predetermined number of MOS transistors among the plurality of MOS transistors of the second conductive type, and outputs the test signal having the second logic level to the rest of MOS transistors.

Preferably, the semiconductor memory device further includes an internal voltage generating circuit for generating the precharge voltage. The voltage supplying circuit includes: a plurality of MOS transistors of a first conductive type connected in parallel between the output node and the internal voltage generating circuit; and a plurality of MOS transistors of a second conductive type connected in parallel between the output node and the internal voltage generating circuit. Each of the plurality of MOS transistors of the first conductive type is turned off when the test signal having the first logic level is received at its gate terminal and is turned on when the test signal having the second logic level is received at its gate terminal. Each of the plurality of MOS transistors of the second conductive type is turned on when the test signal having the first logic level is received at its gate terminal and is turned off when the test signal having the second logic level is received at its gate terminal. In the test mode, the test signal generating circuit outputs the test signal having the second logic level to a predetermined number of MOS transistors among the plurality of MOS transistors of the first conductive type, outputs the test signal having the first logic level to the rest of MOS transistors, outputs the test signal having the first logic level to a predetermined number of MOS transistors out of the plurality of MOS transistors of the second conductive type, and outputs the test signal having the second logic level to the rest of MOS transistors. In the normal operation mode, the test signal generating circuit outputs the test signal having the second logic level to the plurality of MOS transistors of the first conductive type, and outputs the test signal having the first logic level to the plurality of MOS transistors of the second conductive type.

Preferably, the internal source voltage is a cell plate voltage for storing the data into the memory cell, and the source voltage supplying circuit supplies the cell plate voltage to a cell plate electrode in the memory cell.

Preferably, the semiconductor memory device further includes a test signal generating circuit for generating a test signal having either a first logic level or a second logic level. The source voltage supplying circuit includes: an output node for supplying the cell plate voltage to the cell plate electrode; and a voltage supplying circuit for supplying the cell plate voltage directly to the output node on receipt of a test signal having the first logic level, and for supplying the cell plate voltage to the output node via the impedance on receipt of a test signal having the second logic level.

Preferably, the semiconductor memory device further includes: an internal voltage generating circuit for generating the cell plate voltage in the normal operation mode; and a pad to which the cell plate voltage is supplied in the test mode. The output node is connected to the internal voltage generating circuit. The voltage supplying circuit includes: a plurality of MOS transistors of a first conductive type connected in parallel between the output node and the pad; and a plurality of MOS transistors of a second conductive type connected in parallel between the output node and the pad. Each of the plurality of MOS transistors of the first conductive type is turned off when the test signal having the first logic level is received at its gate terminal, and is turned on when the test signal having the second logic level is received at its gate terminal. Each of the plurality of MOS transistors of the second conduction type is turned on when the test signal having the first logic level is received at its gate terminal, and is turned off when the test signal having the second logic level is received at its gate terminal. In the test mode, the test signal generating circuit outputs the test signal having the second logic level to a predetermined number of MOS transistors among the plurality of MOS transistors of the first conductive type, outputs the test signal having the first logic level to the rest of MOS transistors, outputs the test signal having the first logic level to a predetermined number of MOS transistors among the plurality of MOS transistors of the second conductive type, and outputs the test signal having the second logic level to the rest of MOS transistors.

Preferably, the semiconductor memory device further includes an internal voltage generating circuit for generating the cell plate voltage. The voltage supplying circuit includes: a plurality of MOS transistors of a first conductive type connected in parallel between the output node and the internal voltage generating circuit; and a plurality of MOS transistors of a second conductive type connected in parallel between the output node and the internal voltage generating circuit. Each of the plurality of MOS transistors of the first conductive type is turned off when the test signal having the first logic level is received at its gate terminal, and is turned on when the test signal having the second logic level is received at its gate terminal. Each of the plurality of MOS transistors of the second conductive type is turned on when the test signal having the first logic level is received at its gate terminal and is turned off when the test signal having the second logic level is received at its gate terminal. In the test mode, the test signal generating circuit outputs the test signal having the second logic level to a predetermined number of MOS transistors among the plurality of MOS transistors of the first conductive type, outputs the test signal having the first logic level to the rest of MOS transistors, outputs the test signal having the first logic level to a predetermined number of MOS transistors in the plurality of MOS transistors of the second conductive type, and outputs the test signal having the second logic level to the rest of MOS transistors. In the normal operation mode, the test signal generating circuit outputs the test signal having the second logic level to the plurality of MOS transistors of the first conductive type, and outputs the test signal having the first logic level to the plurality of MOS transistors of the second conductive type.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a timing chart of read data in a test mode;

FIG. 8 is a block diagram for explaining a method of supplying the ground voltage to a memory cell array in the second embodiment;

DESCRIPTION OF THE PREFERRED EMBODIMENTS

Figure 1:
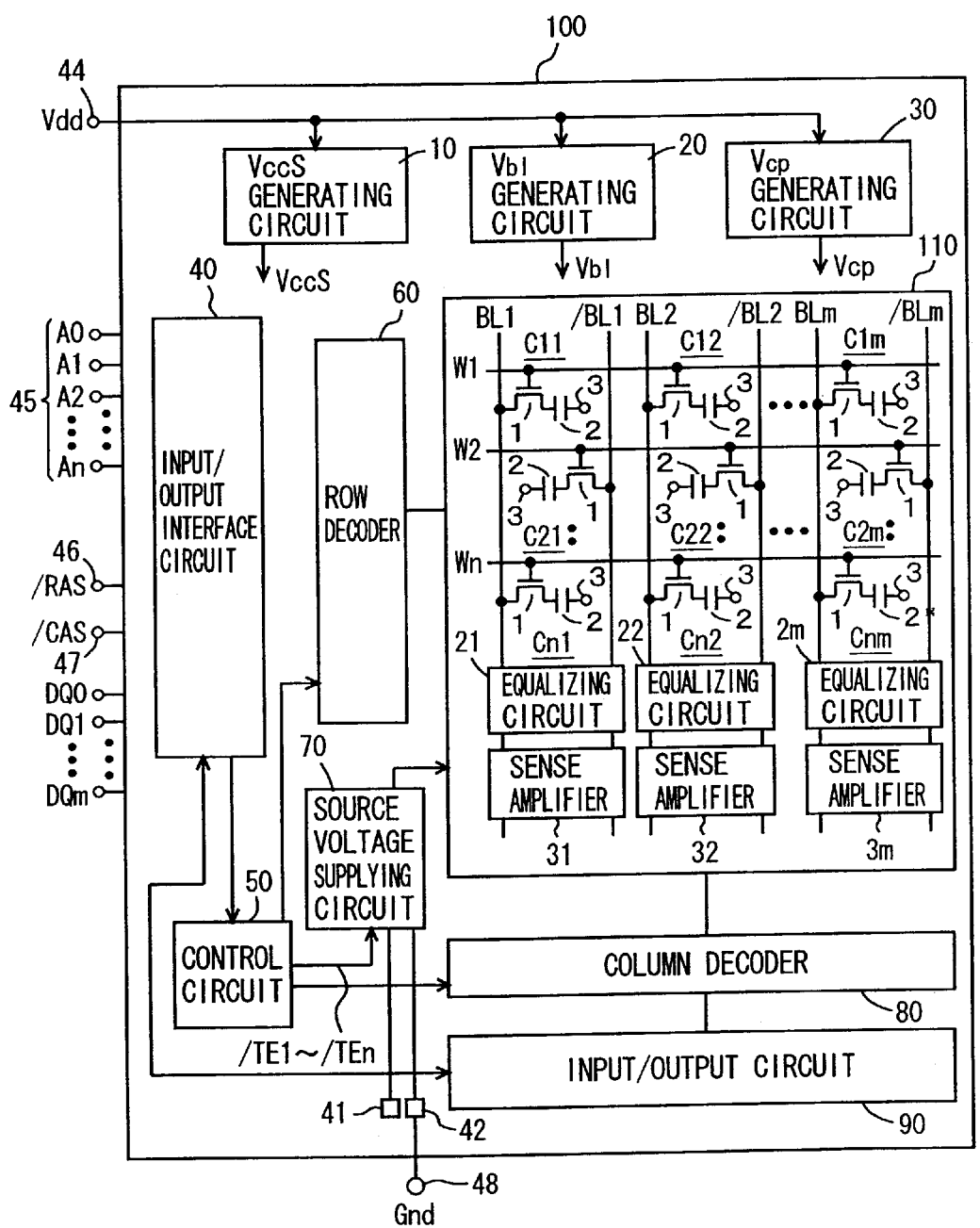
FIG. 1 is a schematic block diagram of a semiconductor memory device according to a first embodiment.

Embodiments of the invention will be described in detail with reference to the drawings. The same or corresponding components in the drawings are designated by the same reference numeral and the description will not be repeated.

[First Embodiment]

Referring to FIG. 1, a semiconductor memory device 100 according to a first embodiment has a VccS generating circuit 10, a Vbl generating circuit 20, a Vcp generating circuit 30, an input/output interface circuit 40, pads 41 and 42, terminals 44 to 48, input/output terminals DQ0 to DQm, a control circuit 50, a row decoder 60, a source voltage supplying circuit 70, a column decoder 80, an input/output circuit 90, and a memory cell array 110.

Memory cell array 110 includes memory cells C11 to C1m, C21 to C2m, . . . , and Cn1 to Cnm, bit line pairs BL1 and /BL1 to BLm and /BLm, word lines W1 to Wn, equalizing circuits 21 to 2m, and sense amplifiers 31 to 3m.

VccS generating circuit 10 drops external source voltage Vdd supplied from terminal 44 to thereby generate memory array voltage VccS and outputs the generated memory array voltage VccS to memory cell array 110. Vbl generating circuit 20 drops external source voltage Vdd supplied from terminal 44 to thereby generate precharge voltage Vbl (=Vdd/2) and outputs the generated precharge voltage Vbl to equalizing circuits 21 to 2m included in memory cell array 110. Vcp generating circuit 30 drops external source voltage Vdd supplied from terminal 44 to thereby generate cell plate voltage Vcp and outputs the generated cell plate voltage Vcp to terminals 3 of memory cells C11 to C1m, C21 to C2m, . . . , and Cn1 to Cnm.

Input/output interface circuit 40 receives address signals A0 to An input from terminal 45, a row address strobe signal /RAS input from terminal 46, a column address strobe signal /CAS input from terminal 47, and write data input from input/output terminals DQ0 to DQm, outputs the received address signals A0 to An, row address strobe signal /RAS, and column address strobe signal /CAS to control circuit 50, and outputs the write data to input/output circuit 90. Input/output interface circuit 40 outputs the read data from input/output circuit 90 to input/output terminals DQ0 to DQm.

Pad 41 supplies a ground voltage GndT used in a test mode to source voltage supplying circuit 70. Pad 42 receives a ground voltage Gnd used in a normal mode from terminal 48 and supplies the received ground voltage Gnd to source voltage supplying circuit 70.

Control circuit 50 receives address signals A0 to An, row address strobe signal /RAS, and column address strobe signal /CAS from input/output interface circuit 40, outputs input address signals A0 to An as a row address to row decoder 60 at a timing row address strobe signal /RAS is switched from the H (logical high) level to the L (logical low) level, and outputs input address signals A0 to An as a column address to column decoder 80 at a timing column address strobe signal /CAS is switched from the H level to the L level. When address signals A0 to An in a specific pattern are input, control circuit 50 generates test signals /TE1 to /TEn and outputs the generated test signals /TE1 to /TEn to source voltage supplying circuit 70. Further, control circuit 50 performs various controls.

Row decoder 60 decodes a row address input from control circuit 50, and activates one of word lines W1 to Wn, which is designated by the decoded row address. Source voltage supplying circuit 70 supplies either ground voltage GndT supplied from pad 41 or ground voltage Gnd supplied from pad 42 to sense amplifiers 31 to 3m in memory cell array 110 on the basis of test signals /TE1 to /TEn by a method which will be described hereinlater. Column decoder 80 decodes a column address input from control circuit 50 and activates one of bit line pairs BL1 and /BL1 to BLm and /BLm designated by the decoded column address.

Input/output circuit 90 writes write data input from input/output interface circuit 40 to the one of bit line pairs BL1 and /BL to BLm and /BLm which is activated by column decoder 80. Input/output circuit 90 outputs data read from the one of bit line pairs BL1 and /BL1 to BLm and /BLm activated by column decoder 80 to input/output interface circuit 40.

Each of memory cells C11 to C1m, C21 to C2m, . . . , and Cn1 to Cnm includes an N-channel MOS transistor 1, a capacitor 2, and a terminal 3. N-channel MOS transistor 1 has a source terminal connected to any of bit lines BL1 to BLm or /BL1 to /BLm, a drain terminal connected to one of electrodes of capacitor 2, and a gate terminal for receiving a voltage on any of word lines W1 to Wn. The other electrode (cell plate electrode) of capacitor 2 is connected to terminal 3, and is supplied with cell plate voltage Vcp from Vcp generating circuit 30 via terminal 3.

Equalizing circuits 21 to 2m are provided in correspondence with the bit line pairs BL1 and /BL1 to BLm and /BLm, respectively. Before inputting/outputting data to/from any of memory cells C11 to C1m, C21 to C2m, . . . , and Cn1 to Cnm, any of bit line pairs BL1 and /BL1 to BLm and /BLm is equalized to precharge voltage Vbl (=Vdd/2).

Sense amplifiers 31 to 3m are provided in correspondence with bit line pairs BL1 and /BL1 to BLm and /BLm, respectively. Sense amplifiers 31 to 3m determine logic levels of data read on bit line pairs BL1 and /BL1 to BLm and /BLm, amplify the read data in response to the determined logic levels, and output the amplified data to input/output circuit 90. Sense amplifiers 31 to 3m transfer data written by input/output circuit 90 to the bit line pairs BL1 and /BL1 to BLm and /BLm, respectively.

Figure 2:
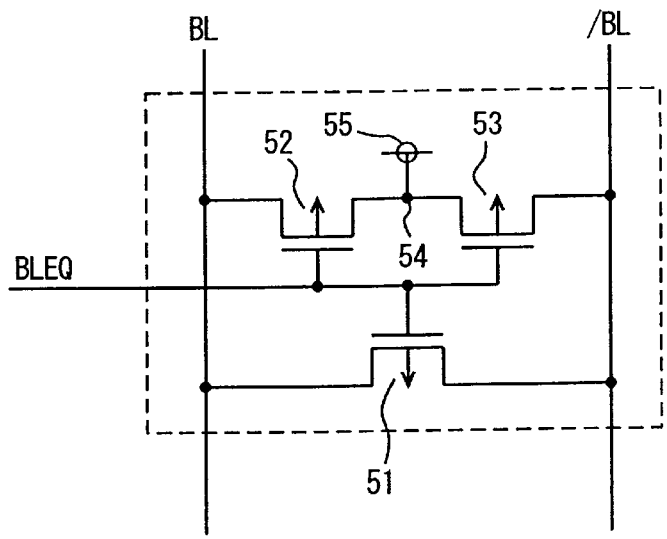
FIG. 2 is a circuit diagram of an equalizing circuit shown in FIG. 1.

Referring to FIG. 2, each of equalizing circuits 21 to 2m has P-channel MOS transistors 51 to 53. P-channel MOS transistor 51 is connected between bit line BL (any of BL1 to BLm) and bit line /BL (any of /BL1 to /BLm) and has a gate terminal for receiving a bit line equalize signal BLEQ. P-channel MOS transistors 52 and 53 are connected in series between bit line BL (any of BL1 to BLm) and bit line /BL (any of /BL1 to /BLm). Each of P-channel MOS transistors 52 and 53 has a gate terminal for receiving bit line equalize signal BLEQ. Precharge voltage Vbl (=Vdd/2) is supplied from a power supply node 55 to a node 54.

When bit line equalize signal BLEQ of the L level is input, P-channel MOS transistors 52 and 53 are turned on, and the equalize circuit (21 to 2m) supplies precharge voltage Vbl (=Vdd/2) from node 54 to the bit line pair BL and /BL. In this case, P-channel MOS transistor 51 is also turned on, so that the potential on bit line BL becomes equal to that on bit line /BL, and the bit line pair BL and /BL is equalized to precharge voltage Vbl.

Figure 3:
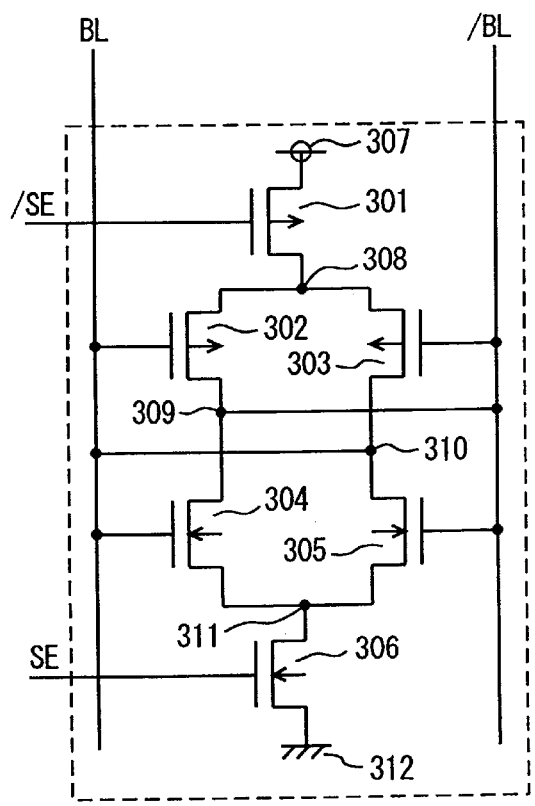
FIG. 3 is a circuit diagram of a sense amplifier shown in FIG. 1.

Referring to FIG. 3, each of sense amplifiers 31 to 3m includes P-channel MOS transistors 301 to 303 and N-channel MOS transistors 304 to 306. P-channel MOS transistor 301 is connected between a power supply node 307 and a node 308 and has a gate terminal for receiving a sense amplifier activation signal /SE. P-channel MOS transistor 302 and N-channel MOS transistor 304 are connected in series between node 308 and a node 311. P-channel MOS transistor 303 and N-channel MOS transistor 305 are connected in series between nodes 308 and 311. P-channel MOS transistor 303 and N-channel MOS transistor 305 are connected in parallel with P-channel MOS transistor 302 and N-channel MOS transistor 304. N-channel MOS transistor 306 is connected between node 311 and a ground node 312 and has a gate terminal for receiving a sense amplifier activation signal SE.

Each of P-channel MOS transistor 302 and N-channel MOS transistor 304 receives a voltage on bit line BL by its gate terminal. Each of P-channel MOS transistor 303 and N-channel MOS transistor 305 receives a voltage on bit line /BL by its gate terminal. A node 309 is connected to bit line /BL, and a node 310 is connected to bit line BL.

Memory array voltage VccS is supplied from VccS generating circuit 10 to power supply node 307. To ground node 312, as will be described hereinlater, ground voltage Gnd or GndT is supplied.

When H-level sense amplifier activatation signal SE of H level is input, P-channel MOS transistor 301 and N-channel MOS transistor 306 are turned on, and sense amplifiers 31 to 3m are activated. When data is read from one of memory cells C11 to C1m, ... , and Cn1 to Cnm, the voltage of Vdd/2+α is transmitted on bit line BL, and the voltage on bit line /BL is precharge voltage Vdd/2, each of P-channel MOS transistor 302 and N-channel MOS transistor 304 receives the voltage Vdd/2+α by its gate terminal, and each of P-channel MOS transistor 303 and N-channel MOS transistor 305 receives voltage Vdd/2 by its gate terminal. The voltage on node 310 becomes Vdd/2+α, and the voltage applied to the drain terminal of P-channel MOS transistor 303 becomes higher than voltage Vdd/2 applied to the gate terminal, so that P-channel MOS transistor 303 is turned on. Memory array voltage VccS is consequently supplied from power supply node 307 to node 310 via P-channel MOS transistors 301 and 303, and the voltage on bit line BL increases to memory array voltage VccS. Therefore, P-channel MOS transistor 302 is turned off, N-channel MOS transistor 304 is turned on, and ground voltage Gnd or GndT is supplied from ground node 312 to node 309 via N-channel MOS transistors 304 and 306. As a result, the voltage on bit line /BL drops to ground voltage Gnd or GndT, and it finishes the operation of sensing read data in sense amplifiers 31 to 3m.

Figure 4:
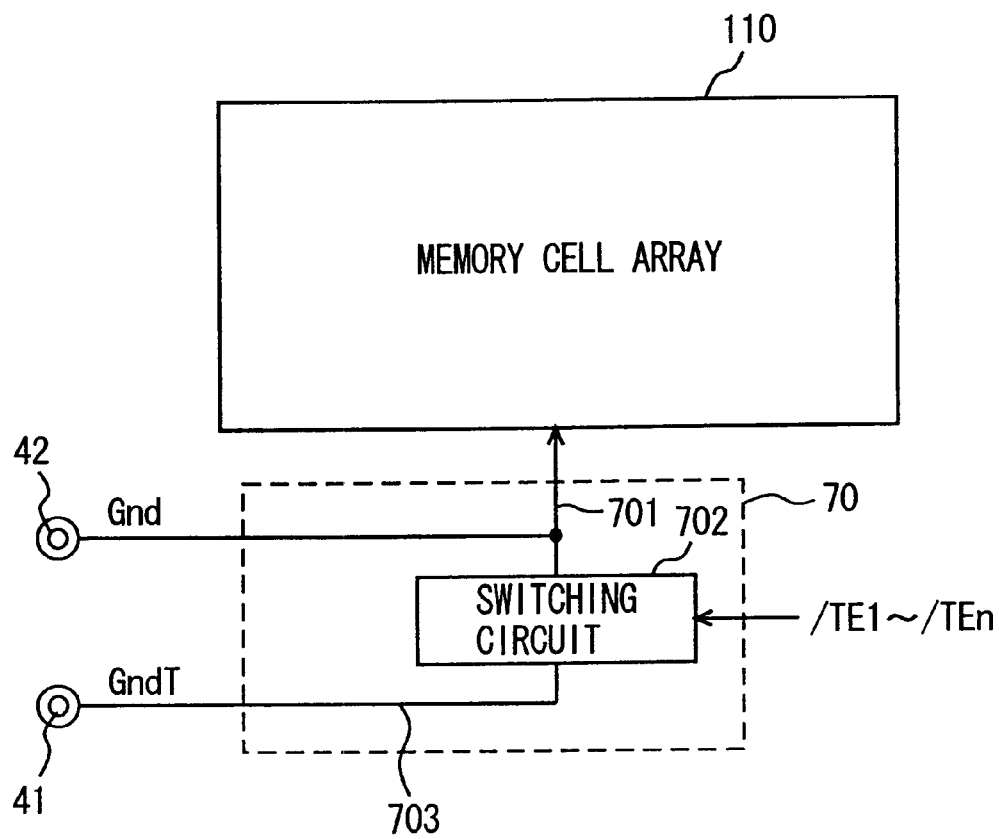
FIG. 4 is a block diagram for explaining a method of supplying a ground voltage to a memory cell array in the first embodiment.

Referring to FIG. 4, source voltage supplying circuit 70 includes an output node 701, a switching circuit 702, and a node 703. Output node 701 is connected to pad 42. Switching circuit 702 is disposed between output node 701 and node 703. Node 703 connects pad 41 to switching circuit 702.

Figure 5:
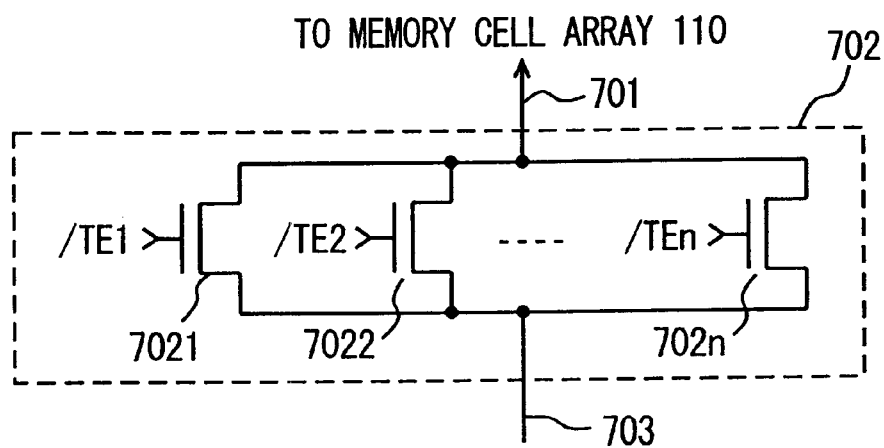
FIG. 5 is a circuit diagram of a switching circuit shown in FIG. 4.

Referring to FIG. 5, switching circuit 702 includes N-channel MOS transistors 7021 to 702n. N-channel MOS transistors 7021 to 702n are connected in parallel between output node 701 and node 703. N-channel MOS transistors 7021 to 702n receive test signals /TE1 to /TEn at their gate terminals, respectively.

When test signal /TE1 of H level and test signals /TE2 to /TEn of L level are input to switching circuit 702, N-channel MOS transistor 7021 is turned on, and N-channel MOS transistors 7022 to 702n are turned off. As a result, ground voltage GndT supplied from pad 41 to node 703 is supplied to output node 701 via N-channel MOS transistor 7021. That is, ground voltage GndT is supplied to output node 701 via an impedance which is an ON-state resistance of N-channel MOS transistor 7021.

Ground voltage GndT on output node 701 is supplied to ground node 312 in sense amplifiers 31 to 3m included in memory cell array 110. In this case, ground voltage GndT is supplied via the impedance which is higher than that in normal operation mode, so that the voltage difference between bit lines BL and /BL at the time of reading data increases more slowly as compared with the case where the ground voltage is directly supplied. Specifically, as shown in FIG. 6, it requires longer time for the period since timing T3 at which sense amplifiers 31 to 3m start the sensing operation to increase the voltage on bit line BL to memory array voltage VccS until timing T4 at which an operation of dropping the voltage on bit line /BL to ground voltage GndT. The float of ground voltage Gnd of a memory cell array is larger than that in the normal operation mode.

Consequently, in the period from T3 to T4, it becomes difficult to determine whether the level of the data read from a memory cell having a narrow margin is high or low, so that an error tends to occur. Therefore, a memory cell having no margin can be easily detected.

Referring again to FIG. 5, by controlling the logic levels of test signals /TE1 to /TEn, the number of N-channel MOS transistors which can be turned on can be controlled, and the impedance at the time of supplying ground voltage GndT to output node 701 can be controlled. When all test signals /TE1 to /TEn have the H level, N-channel MOS transistors 7021 to 702n are turned on, and ground voltage GndT is supplied to output node 701 via no impedance.

Referring again to FIG. 4, in the normal operation mode, control circuit 50 generates test signals /TE1 to /TEn of L level and outputs them to source voltage supplying circuit 70. Then, ground voltage Gnd is supplied from terminal 48 to pad 42.

Consequently, all N-channel MOS transistors 7021 to 702n of switching circuit 702 are turned off, and source voltage supplying circuit 70 supplies ground voltage Gnd supplied from the outside to sense amplifiers 31 to 3m in memory cell array 110 via output node 701.

In the test mode, control circuit 50 generates test signals /TE1 to /TEn. Some of the test signals /TE1 to /TEn have/has the H level and the other have the L level. Control circuit 50 outputs generated test signals /TE1 to /TEn to source voltage supplying circuit 70. Ground voltage Gnd is not supplied from terminal 48 to pad 42. Ground voltage GndT supplied from pad 41 is supplied to output node 701 via the impedance of the N-channel MOS transistor which is turned on. Source voltage supplying circuit 70 supplies ground voltage GndT to sense amplifiers 31 to 3m in memory cell array 110 via output node 701. In the sensing operation by the sense amplifiers 31 to 3m, a memory cell having no margin can be detected.

Referring again to FIG. 1, operations of writing/reading data to/from memory cells C11 to C1m, . . . , and Cn1 to Cnm in semiconductor memory device 100 will now be described. In the following description, it is provided that, before the operations of writing/reading data are started, bit line equalize signal BLEQ is input and equalizing circuits 21 to 2m equalize the bit line pairs BL1 and /BL1 to BLm and /BLm, respectively.

First, the data writing operation will be described. When address signals A0 to An are input from terminal 45, row address strobe signal /RAS is input from terminal 46, column address strobe signal /CAS is input from terminal 47, and write data is input from input/output terminals DQ0 to DQm, input/output interface circuit 40 outputs address signals A0 to An, row address strobe signal /RAS, and column address strobe signal /CAS to control circuit 50 and outputs write data to input/output circuit 90.

Control circuit 50 outputs, as a row address, address signals A0 to An input at a timing when row address strobe signal /RAS changes from the H level to the L level to row decoder 60 and outputs, as a column address, address signals A0 to An which are input at a timing when column address strobe signal /CAS changes from the H level to the L level to column decoder 80. Control circuit 50 generates test signals /TE1 to /TEn of L level on the basis of address signals A0 to An and outputs the generated test signals /TE1 to /TEn to source voltage supplying circuit 70. By the operation, all N-channel MOS transistors 7021 to 702n in switching circuit 702 are turned off, and source voltage supplying circuit 70 supplies ground voltage Gnd applied from terminal 48 to pad 42 directly to memory cell array 110.

Row decoder 60 decodes the row address and activates one of word lines W1 to Wn designated by the decoded row address. For example, row decoder 60 activates word line W1. On the other hand, column decoder 80 decodes the column address and activates one of the bit line pairs BL1 and /BL1 to BLm and /BLm designated by the decoded column address. For example, column decoder 80 activates the bit line pair BL1 and /BL1.

Input/output circuit 90 writes write data into the activated bit line pair BL1 and /BL1. The write data written in the bit line pair BL1 and /BL1 is transmitted via the bit line pair BL1 and /BL1 and is written in memory cell C11 activated by word line W1 and the bit line pair BL1 and /BL1. By repeating the above-described operations, data is written in memory cells C11 to C1m, . . . , and Cn1 to Cnm.

The data reading operation will now be described. When address signals A0 to An are input from terminal 45, row address strobe signal /RAS is input from terminal 46, and column address strobe signal /CAS is input from terminal 47, input/output interface circuit 40 outputs address signals A0 to An, row address strobe signal /RAS, and column address strobe signal /CAS to control circuit 50.

Control circuit 50 outputs, as a row address, address signals A0 to An which are input at a timing when row address strobe signal /RAS changes from the H level to the L level to row decoder 60 and outputs, as a column address, address signals A0 to An which are input at a timing when column address strobe signal /CAS changes from the H level to the L level to column decoder 80. In this case as well, control circuit 50 generates test signals /TE1 to /TEn of L level on the basis of address signals A0 to An and outputs the generated test signals /TE1 to /TEn to source voltage supplying circuit 70. By the operation, all N-channel MOS transistors 7021 to 702n in switching circuit 702 are turned off, and source voltage supplying circuit 70 supplies ground voltage Gnd applied from terminal 48 to pad 42 directly to memory cell array 110.

Row decoder 60 decodes the row address and activates one of word lines W1 to Wn designated by the decoded row address. For example, row decoder 60 activates word line W2. On the other hand, column decoder 80 decodes the column address and activates one of the bit line pairs BL1 and /BL1 to BLm and /BLm designated by the decoded column address. For example, column decoder 80 activates the bit line pair BLm and /BLm.

Data is read from memory cell C2m activated by word line W2 and the bit line pair BLm and /BLm. Sense amplifier 3m determines the logic level of read data on the bit line pair BLm and /BLm, amplifies the read data in response to the determined logic level, and outputs the amplified data to input/output circuit 90. Input/output circuit 90 outputs the read data to input/output terminals DQ0 to DQm via input/output interface circuit 40. By repeating the operations described above, data is read from memory cells C11 to C1m, . . . , and Cn1 to Cnm.

The operation of semiconductor memory device 100 in the test mode will be described. The operation of writing data to memory cells C11 to C1m, . . . , and Cn1 to Cnm in the test mode is the same as that in the normal operation mode.

In an operation of reading data from memory cells C11 to C1m, and Cn1 to Cnm in the test mode, control circuit 50 generates test signals /TE1 to /TEn. Some of test signals /TE1 to /TEn have/has the H level and the other have the L level. Control circuit 50 outputs generated test signals /TE1 to /TEn to source voltage supplying circuit 70. A part of N-channel MOS transistors 7021 to 702n in switching circuit 702 is turned on and source voltage supplying circuit 70 supplies, as described above, ground voltage GndT supplied from pad 41 to sense amplifiers 31 to 3m in memory cell array 110 via the impedance. In this case, ground voltage Gnd is not supplied from terminal 48. The above-described data reading operation is performed and a memory cell having no margin is detected.

At the time of shipment of semiconductor memory device 100, N-channel MOS transistors 7021 to 702n constructing switching circuit 702 may be always on or off for the reason that ground voltage Gnd is supplied via terminal 48 and pad 42 after shipment.

According to the first embodiment, the semiconductor memory device has the source voltage supplying circuit of supplying the ground voltage directly to the memory cell array in the normal operation mode and supplying the ground voltage to the memory cell array via the impedance in the test mode. Thus, a memory cell having no margin can be easily detected by a single test.

Further, in the source voltage supplying circuit, the impedance for supplying the ground voltage can be switched in a plurality of levels, so that a test can be conducted while changing the range of a margin.

[Second Embodiment]

Figure 7:
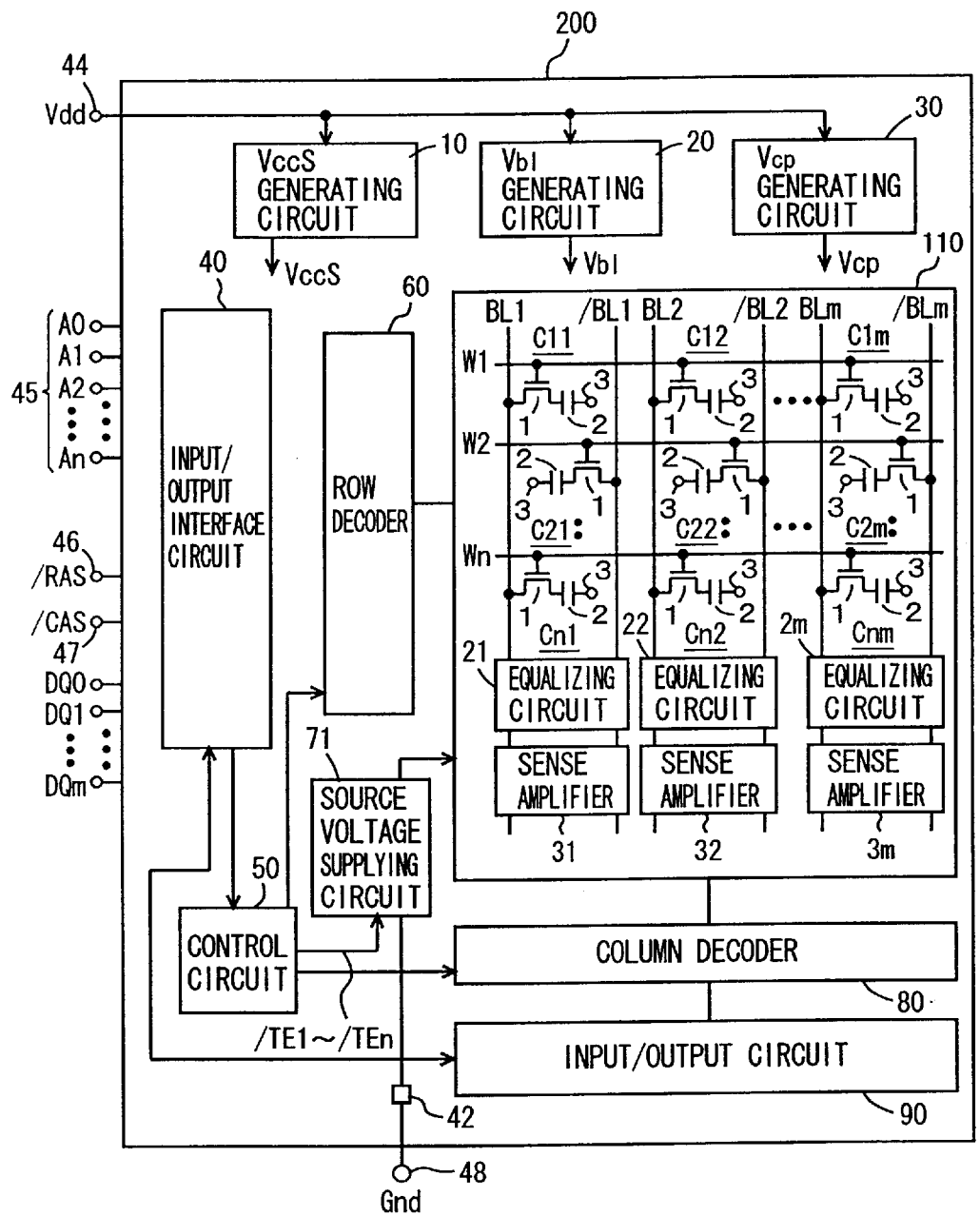
FIG. 7 is a schematic block diagram of a semiconductor memory device according to a second embodiment.

Referring to FIG. 7, a semiconductor memory device 200 according to a second embodiment is the same as semiconductor memory device 100 except that source voltage supplying circuit 70 in semiconductor memory device 100 is replaced by a source voltage supplying circuit 71 and pad 41 is eliminated. Referring to FIG. 8, source voltage supplying circuit 71 includes output node 701, switching circuit 702, and a node 704. Switching circuit 702 is disposed between output node 701 and node 704. Node 704 connects pad 42 to switching circuit 702 to apply ground voltage Gnd supplied from pad 42 to switching circuit 702..

In semiconductor memory device 200, in the normal operation mode, control circuit 50 generates test signals /TE1 to /TEn of H level on the basis of address signals A0 to An and outputs them to source voltage supplying circuit 71. In the test mode, control circuit 50 generates test signals /TE1 to /TEn some of which have/has the H level and the other of which have the L level on the basis of address signals A0 to An. Control circuit 50 outputs generated test signals /TE1 to /TEn to source voltage supplying circuit 71.

In the normal operation mode, all N-channel MOS transistors 7021 to 702n are turned on, and source voltage supplying circuit 71 supplies ground voltage Gnd supplied from pad 42 directly to sense amplifiers 31 to 3m in memory cell array 110. In the test mode, a part of N-channel MOS transistors 7021 to 702n is turned on, source voltage supplying circuit 71 supplies ground voltage Gnd supplied from pad 42 to sense amplifiers 31 to 3m in memory cell array 110 via an impedance. Consequently, in the test mode, a memory cell having no margin can be easily detected.

At the time of shipment of semiconductor memory device 200, all N-channel MOS transistors 7021 to 702n constructing switching circuit 702 are turned on.

The data writing/reading operations in semiconductor memory device 200 in the normal operation mode and the test mode are the same as those described in the first embodiment.

According to the second embodiment, the semiconductor memory device has the source voltage supplying circuit of supplying the ground voltage directly to the memory cell array in the normal operation mode and supplying the ground voltage to the memory cell array via the impedance in the test mode. Thus, a memory cell having no margin can be easily detected by a single test.

Further, in the source voltage supplying circuit, the impedance for supplying the ground voltage can be switched in a plurality of levels, so that a test can be conducted while changing the range of a margin.

[Third Embodiment]

Figure 9:
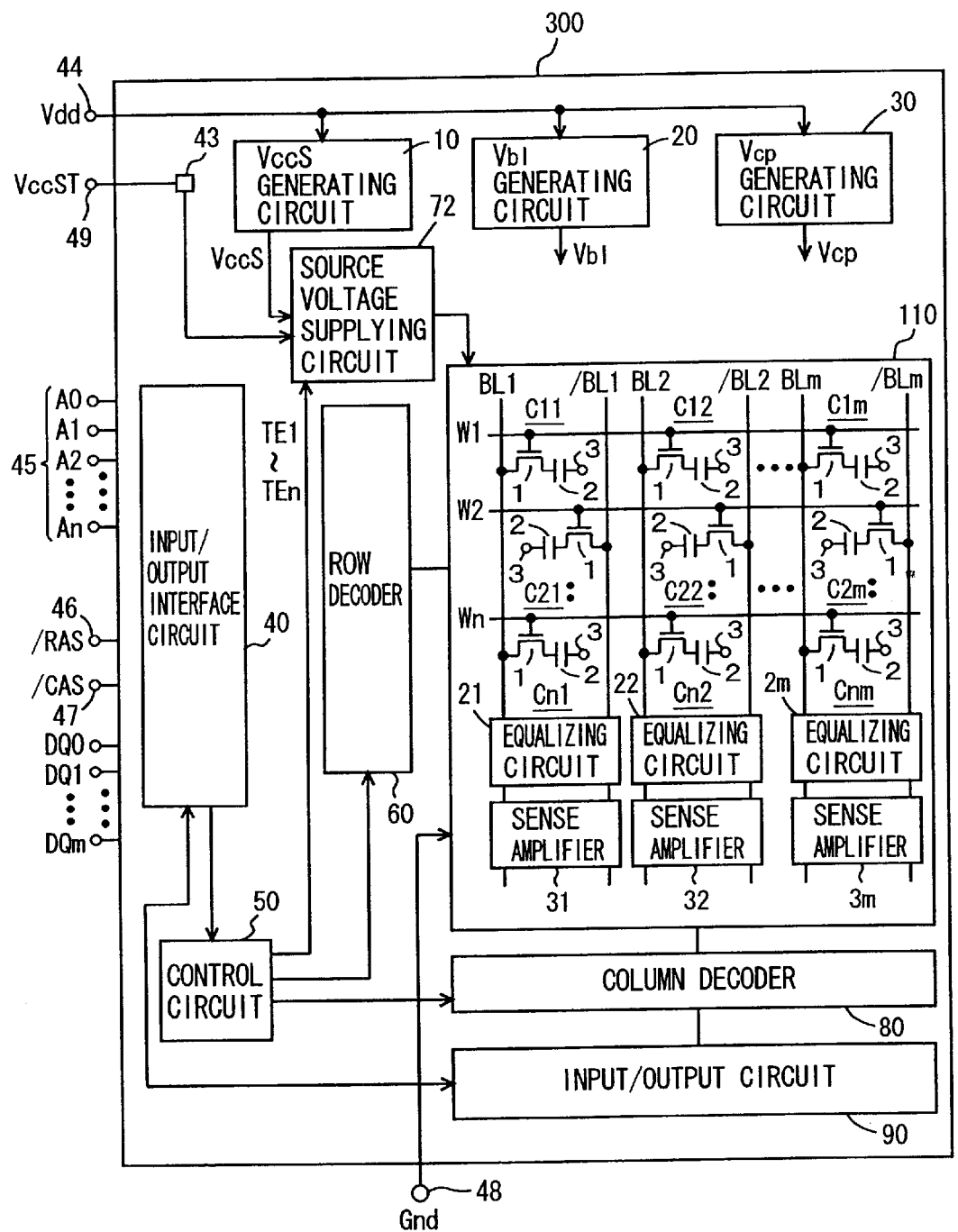
FIG. 9 is a schematic block diagram of a semiconductor memory device according to a third embodiment.

Referring to FIG. 9, a semiconductor memory device 300 according to a third embodiment is the same as semiconductor memory device 100 except that source voltage supplying circuit 70 in semiconductor memory device 100 is replaced by a source voltage supplying circuit 72, pad 42 is eliminated, and a pad 43 and a terminal 49 are added. In semiconductor memory device 300, VccS generating circuit 10 outputs generated memory array voltage VccS to source voltage supplying circuit 72. Control circuit 50 generates test signals /TE1 to /TEn on the basis of address signals A0 to An and outputs them to source voltage supplying circuit 72. Since pad 42 in semiconductor memory device 100 is eliminated, ground voltage Gnd supplied from terminal 48 is directly supplied to memory cell array 110. Pad 43 supplies a memory array voltage VccST input from terminal 49 to source voltage supplying circuit 72. Memory array voltage VccST is a memory array voltage supplied in the test mode.

Figure 10:
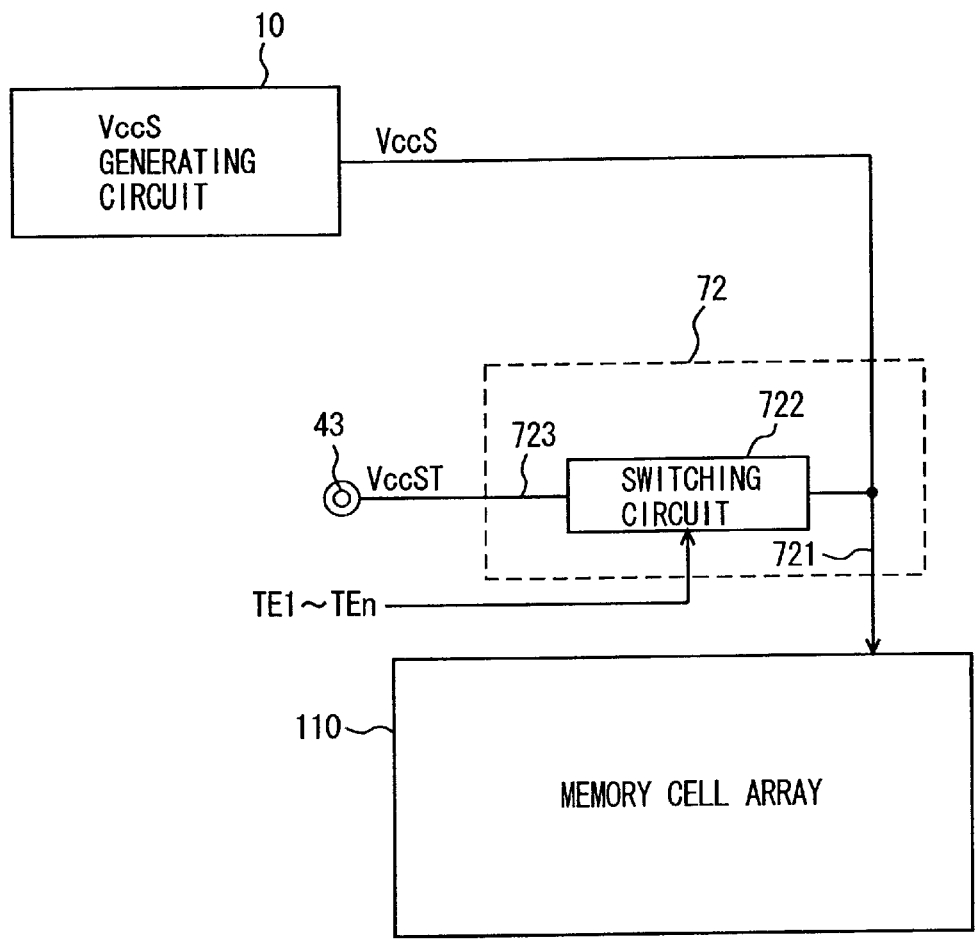
FIG. 10 is a block diagram for explaining a method of supplying a memory array voltage to a memory cell array in the third embodiment.

Referring to FIG. 10, source voltage supplying circuit 72 includes an output node 721, a switching circuit 722, and a node 723. Output node 721 is connected to VccS generating circuit 10. Switching circuit 722 is connected between output node 721 and node 723. Node 723 connects pad 43 to switching circuit 722.

Figure 11:
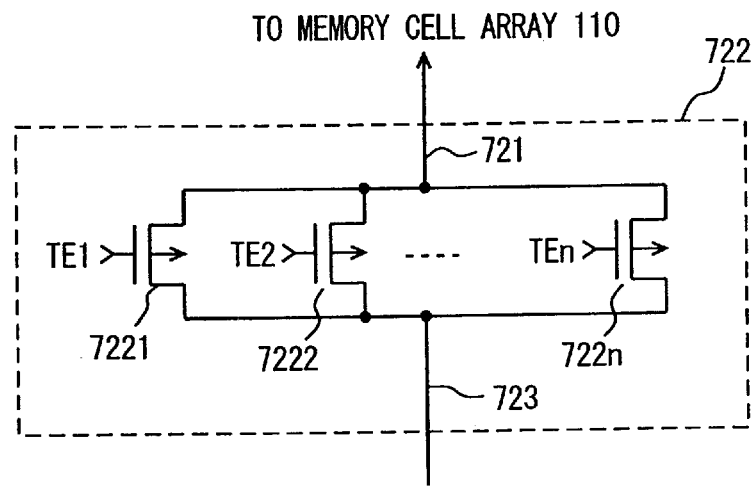
FIG. 11 is a circuit diagram of a switching circuit shown in FIG. 10.

Referring to FIG. 11, switching circuit 722 includes P-channel MOS transistors 7221 to 722n. P-channel MOS transistors 7221 to 722n are connected in parallel between output node 721 and node 723. P-channel MOS transistors 7221 to 722n receive test signals TE1 to TEn at their gate terminals, respectively.

When test signal TE1 of L level and test signals TE2 to TEn of H level are input from control circuit 50 to switching circuit 722, P-channel MOS transistor 7221 is turned on and P-channel MOS transistors 7222 to 722n are turned off. Switching circuit 722 supplies memory array voltage VccST input from node 723 to output node 721 via P-channel MOS transistor 7221. That is, switching circuit 722 supplies memory array voltage VccST to output node 721 via an impedance.

When test signals TE1 to TEn all of which have the L level are input from control circuit 50, all P-channel MOS transistors 7221 to 722n are turned on, so that switching circuit 722 supplies memory array voltage VccST supplied from node 723 directly to output node 721. When test signals TE1 to TEn some of which have/has the L level and the other of which have the H level are input from control circuit 50, P-channel MOS transistor to which the test signal of L level is input is turned on, and P-channel MOS transistor to which the test signal of H level is input is turned off. Consequently, switching circuit 722 supplies memory array voltage VccST input from node 723 to output node 721 while changing the impedance. In such a manner, switching circuit 722 supplies memory array voltage VccST input from node 723 to output node 721 while changing the impedance in response to logic levels of test signals TE1 to TEn supplied from control circuit 50.

Referring again to FIG. 10, in the normal operation mode, since no memory array voltage VccST is supplied from terminal 49, source voltage supplying circuit 72 supplies memory array voltage VccS from VccS generating circuit 10 directly to sense amplifiers 31 to 3m in memory cell array 110 via output node 721.

On the other hand, in the test mode, control circuit 50 outputs an inactivation signal to VccS generating circuit 10 and VccS generating circuit 10 does not generate memory array voltage VccS. Memory array voltage VccST is supplied from terminal 49. Further, control circuit 50 generates test signals TE1 to TEn some of which have/has the L level and the other of which have the H level on the basis of address signals A0 to An, and outputs the generated test signals TE1 to TEn to source voltage supplying circuit 72. Switching circuit 722 outputs memory array voltage VccST input via pad 43 and node 723 to output node 721 via an impedance. Source voltage supplying circuit 72 supplies memory array voltage VccST to sense amplifiers 31 to 3m in memory cell array 110 via output node 721.

Consequently, in the normal operation mode, sense amplifiers 31 to 3m perform a normal sensing operation. In the test mode, sense amplifiers 31 to 3m perform a sensing operation in which the voltage difference between the bit line pairs BL1 and /BL1 to BLm and /BLm slowly increases, that is, the sensing operation shown in FIG. 6.

In the test mode, therefore, by supplying memory array voltage VccST to sense amplifiers 31 to 3m via the impedance, a memory cell having no margin is easily detected.

At the time of shipment of semiconductor memory device 300, P-channel MOS transistors 7221 to 722n constructing switching circuit 722 may be always turned on or off for the reason that memory array voltage VccST is not supplied to terminal 49 and pad 43 after shipment.

The data writing/reading operations in semiconductor memory device 300 in the normal operation mode and the test mode are the same as those described in the first embodiment.

According to the third embodiment, the semiconductor memory device has the source voltage supplying circuit of supplying the memory array voltage directly to the memory cell array in the normal operation mode and supplying the memory array voltage to the memory cell array via the impedance in the test mode. Thus, a memory cell having no margin can be easily detected by a single test.

Further, in the source voltage supplying circuit, the impedance for supplying the memory array voltage can be switched in a plurality of levels, so that a test can be conducted while changing the range of a margin.

[Fourth Embodiment]

Figure 12:
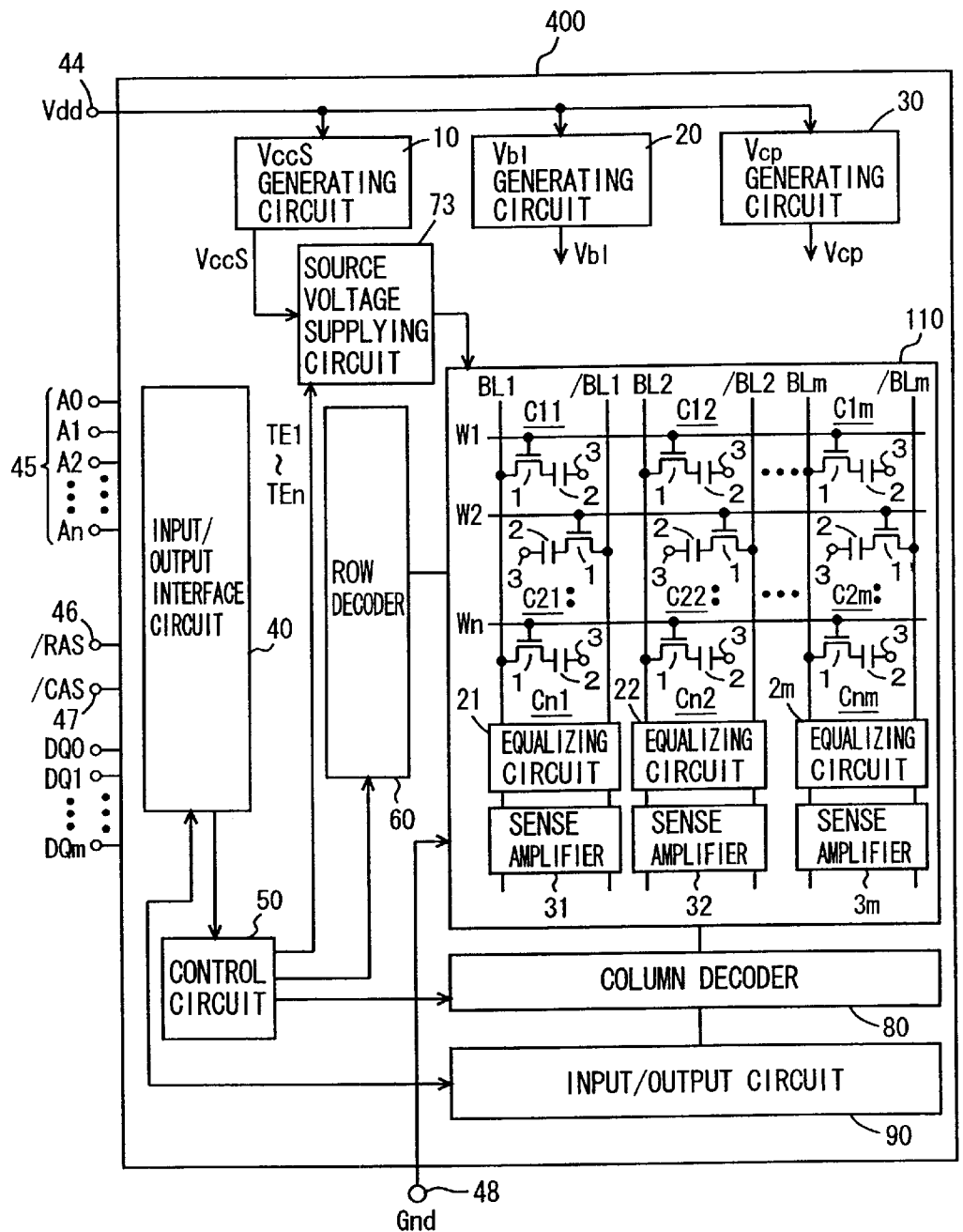
FIG. 12 is a schematic block diagram of a semiconductor memory device according to a fourth embodiment.

Referring to FIG. 12, a semiconductor memory device 400 according to a fourth embodiment is the same as semiconductor memory device 300 except that pad 43 and terminal 49 in that are eliminated and source voltage supplying circuit 72 in that is replaced by a source voltage supplying circuit 73.

In the normal operation mode, source voltage supplying circuit 73 supplies memory array voltage VccS input from VccS generating circuit 10 directly to sense amplifiers 31 to 3m in memory cell array 110. In the test mode, source voltage supplying circuit 73 supplies memory array voltage VccS input from VccS generating circuit 10 to sense amplifiers 31 to 3m in memory cell array 110 via the impedance.

Figure 13:
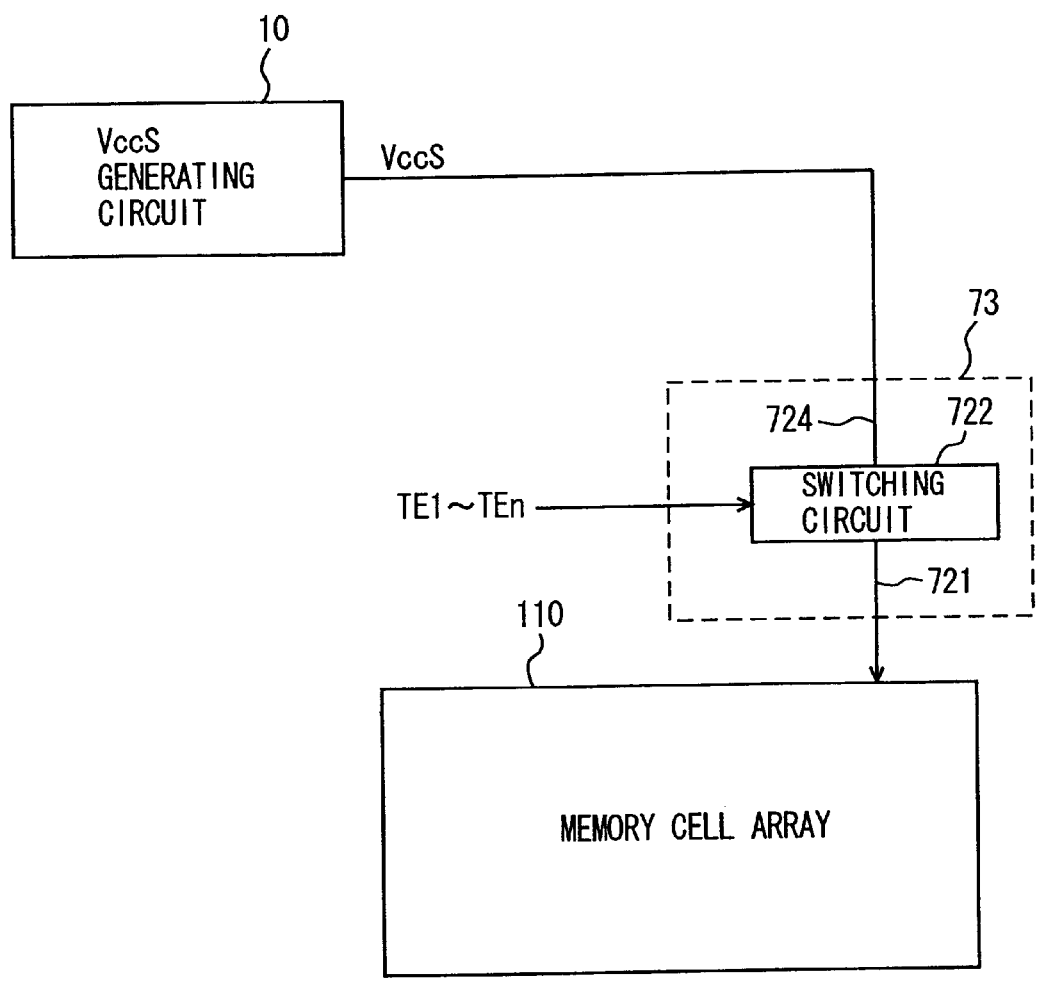
FIG. 13 is a block diagram for explaining a method of supplying a memory array voltage to a memory cell array in the fourth embodiment.

Referring to FIG. 13, source voltage supplying circuit 73 includes output node 721, switching circuit 722, and a node 724. Switching circuit 722 is connected between output node 721 and node 724. Node 724 connects VccS generating circuit 10 to switching circuit 722.

In the normal operation mode, control circuit 50 generates test signals TE1 to TEn all of which have the L level and outputs them to source voltage supplying circuit 73. In the test mode, control circuit 50 generates test signals TE1 to TEn some of which have/has the L level and the other of which have the H level and outputs the signals to source voltage supplying circuit 73.

In the normal operation mode, therefore, switching circuit 722 receives test signals TE1 to TEn all of which have the L level and all P-channel MOS transistors 7221 to 722n are turned on. Switching circuit 722 supplies memory array voltage VccS from VccS generating circuit 10 directly to sense amplifiers 31 to 3m in memory cell array 110 via output node 721.

In the test mode, switching circuit 722 receives test signals TE1 to TEn some of which have/has the L level and the other of which have the H level, P-channel MOS transistor to which the test signal of L level is input is turned on, and P-channel MOS transistor to which the test signal of H level is input is turned off. Consequently, switching circuit 722 supplies memory array voltage VccS input from VccS generating circuit 10 to sense amplifiers 31 to 3m in memory cell array 110 via the impedance.

In such a manner, by switching the logic levels of test signals TE1 to TEn, in the test mode, a memory cell having no margin is detected.

The other detail is the same as that of semiconductor memory device 300. The data writing/reading operations in semiconductor memory device 400 in the normal operation mode or test mode are the same as those described in the first embodiment.

At the time of shipment of semiconductor memory device 400, all P-channel MOS transistors 7221 to 722n constructing switching circuit 722 are set to be ON.

According to the fourth embodiment, the semiconductor memory device has the source voltage supplying circuit of supplying the memory array voltage directly to the memory cell array in the normal operation mode and supplying the memory array voltage to the memory cell array via the impedance in the test mode. Thus, a memory cell having no margin can be easily detected by a single test.

Further, in the source voltage supplying circuit, the impedance for supplying the memory array voltage can be switched in a plurality of levels, so that a test can be conducted while changing the range of a margin.

[Fifth Embodiment]

Figure 14:
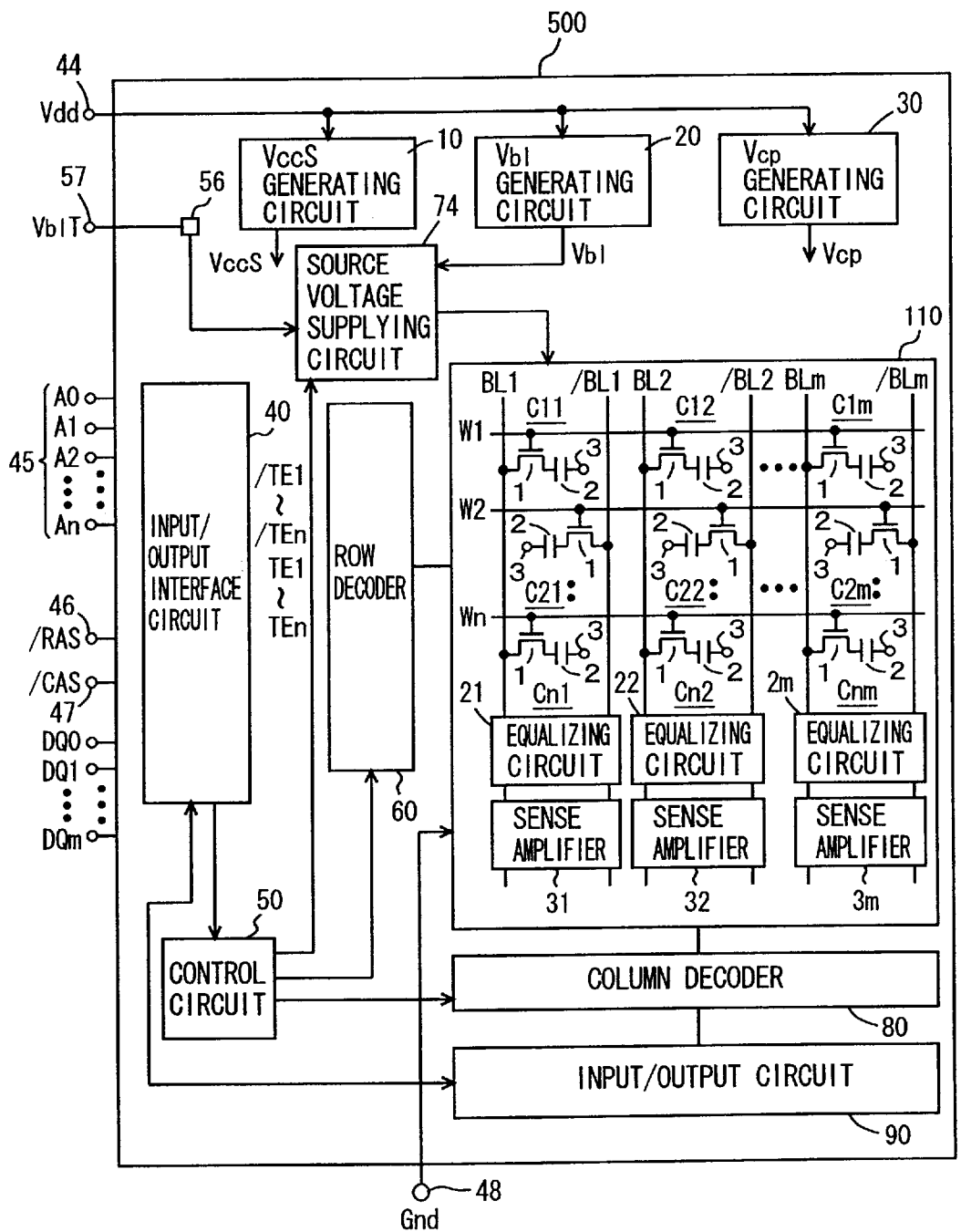
FIG. 14 is a schematic block diagram of a semiconductor memory device according to a fifth embodiment.

Referring to FIG. 14, a semiconductor memory device 500 according to a fifth embodiment is the same as semiconductor memory device 400 except that source voltage supplying circuit 73 in semiconductor memory device 400 is replaced by a source voltage supplying circuit 74, and a pad 56 and a terminal 57 are added. In semiconductor memory device 500, control circuit 50 generates test signals TE1 to TEn and/TE1 to /TEn on the basis of address signals A0 to An and outputs the signals to source voltage supplying circuit 74. Vbl generating circuit 20 outputs generated precharge voltage Vbl to source voltage supplying circuit 74.

Pad 56 outputs a precharge voltage VblT supplied from terminal 57 to source voltage generating circuit 74. Precharge voltage VblT is a precharge voltage supplied in the test mode and is equal to the half of external source voltage Vdd.

In the normal operation mode, source voltage supplying circuit 74 supplies precharge voltage Vbl from Vbl generating circuit 20 directly to equalizing circuits 21 to 2m in memory cell array 110. In the test mode, source voltage supplying circuit 74 supplies precharge voltage VblT input via pad 56 to equalizing circuits 21 to 2m in memory cell array 110 via the impedance.

Figure 15:
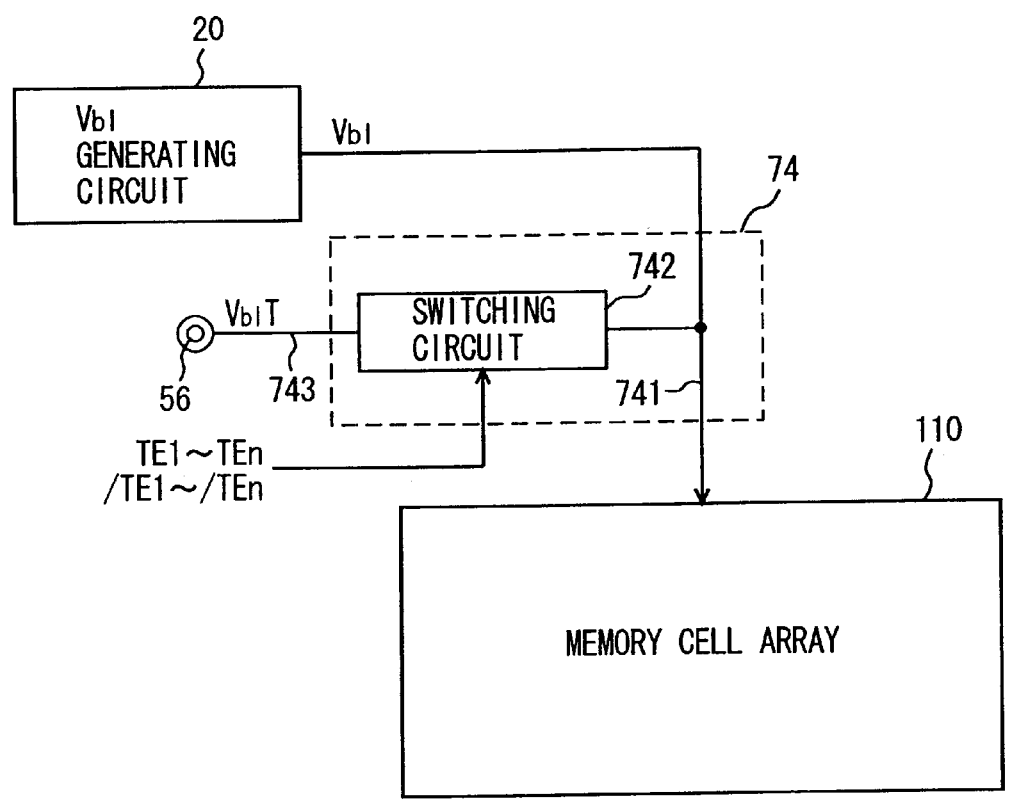
FIG. 15 is a block diagram for explaining a method of supplying a precharge voltage to a memory cell array in the fifth embodiment.

Referring to FIG. 15, source voltage supplying circuit 74 includes an output node 741, a switching circuit 742, and a node 743. Output node 741 is connected to Vbl generating circuit 20 and supplies precharge voltage Vbl to equalizing circuits 21 to 2m in memory cell array 110. Switching circuit 742 is connected between output node 741 and node 743. Node 743 connects pad 53 to switching circuit 742.

Figure 16:
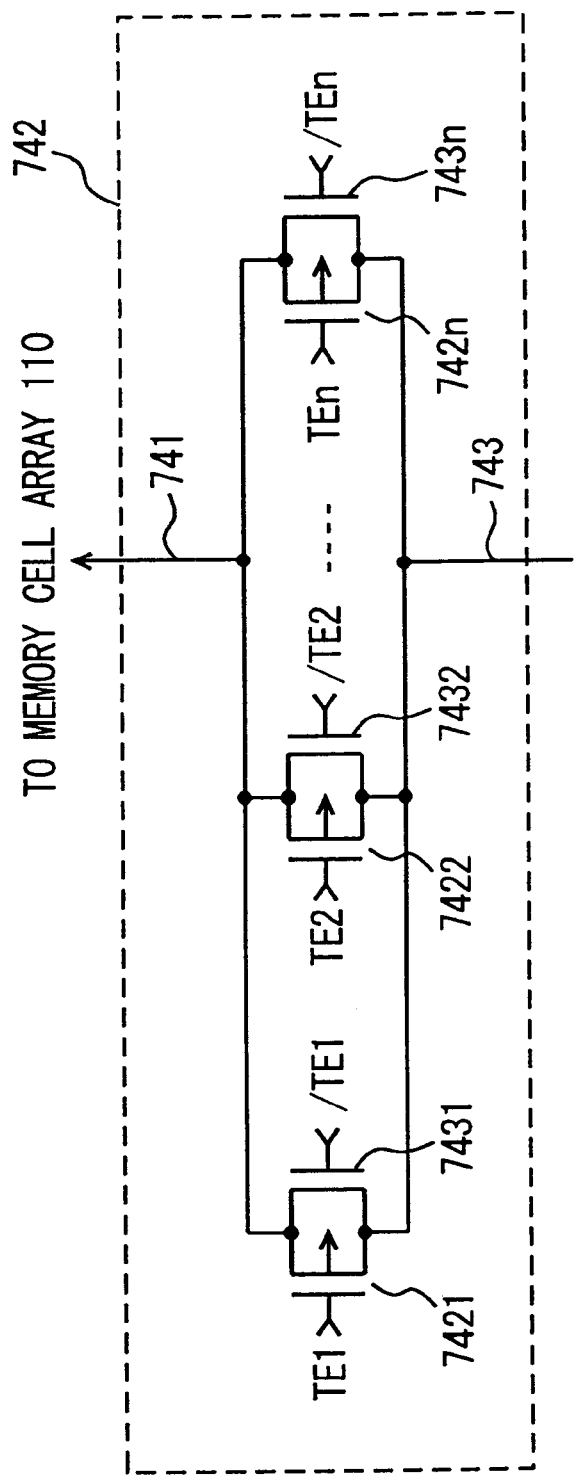
FIG. 16 is a circuit diagram of a switching circuit shown in FIG. 15.

Referring to FIG. 16, switching circuit 742 includes P-channel MOS transistors 7421 to 742n and N-channel MOS transistors 7431 to 743n. P-channel MOS transistors 7421 to 742n are connected in parallel between output node 741 and node 743. P-channel MOS transistors 7421 to 742n receive test signals TE1 to TEn at their gate terminals, respectively. N-channel MOS transistors 7431 to 743n are connected in parallel between output node 741 and node 743. N-channel MOS transistors 7431 to 743n receive test signals /TE1 to /TEn at their gate terminals, respectively.

P-channel MOS transistor 7421 has a source terminal and a drain terminal connected to a source terminal and a drain terminal of N-channel MOS transistor 7431, respectively. P-channel MOS transistor 7422 has a source terminal and a drain terminal connected to a source terminal and a drain terminal of N-channel MOS transistor 7432, respectively. Similarly, P-channel MOS transistor 742n has a source terminal and a drain terminal connected to a source terminal and a drain terminal of N-channel MOS transistor 743n, respectively.

In semiconductor memory device 500, in the normal operation mode, control circuit 50 generates test signals TE1 to TEn all of which have the H level and test signals /TE1 to /TEn all of which have the L level, and outputs the generated test signals TE1 to TEn and /TE1 to /TEn to source voltage supplying circuit 74. In the test mode, control circuit 50 generates test signals TE1 to TEn some of which have/has the L level and the other of which have the H level and test signals /TE1 to /TEn some of which have/has the H level and the other of which have the L level, and outputs the generated test signals TE1 to TEn and /TE1 to /TEn to source voltage supplying circuit 74.

Since test signals TE1 to TEn are complementary to test signals /TE1 to /TEn, respectively, a pair of the P-channel MOS transistor and the N-channel MOS transistor whose source terminals and drain terminals are connected to each other are simultaneously turned on or off. Consequently, in the normal operation mode, when switching circuit 742 receives test signals TE1 to TEn all of which have the H level and test signals /TE1 to /TEn all of which have the L level, P-channel MOS transistors 7421 to 742n and N-channel MOS transistors 7431 to 743n are turned off, and precharge voltage VblT input from node 743 is not supplied to output node 741.

On the other hand, in the test mode, when switching circuit 742 receives test signals TE1 to TEn some of which have/has the L level and the other of which have the H level and test signals /TE1 to /TEn some of which have/has the H level and the other of which have the L level, P-channel MOS transistor to which the test signal TE of L level is input and N-channel MOS transistor to which the test signal /TE of H level is input are turned on to supply precharge voltage VblT supplied to node 743 to output node 741 via the impedance.

When test signals TE1 to TEn all of which have the L level and test signals /TE1 to /TEn all of which have the H level are received, switching circuit 742 supplies precharge voltage VblT input from node 743 to output node 741 via no impedance.

By controlling the number of test signals TE1 to TEn which are set at the L level (that is, the number of test signals /TE1 to /TEn which are set at the H level) by control circuit 50, the impedance in switching circuit 742 is controlled in a plurality of levels.

Both of the P-channel and N-channel MOS transistors are used in switching circuit 742 for the reason that switching circuit 742 supplies precharge voltage VblT which is the half of external source voltage Vdd from node 743 to output node 741. In other words, different from the case of supplying memory array voltage VccST or VccS (refer to the fifth and sixth embodiments), in the case of precharge voltage VblT, since the voltage level is lower than the voltage level of each of memory array voltage VccST and VccS, the impedance at the time of supplying the voltage to the output node 741 has to be low.

Referring again to FIG. 15, in the normal operation mode, source voltage supplying circuit 74 receives test signals TE1 to TEn all of which have the H level and test signals /TE1 to /TEn all of which have the L level from control circuit 50. Consequently, all P-channel MOS transistors 7421 to 742n and N-channel MOS transistors 7431 to 743n in switching circuit 742 are turned off, and source voltage supplying circuit 74 supplies precharge voltage Vbl from Vbl generating circuit 20 directly to equalizing circuits 21 to 2m in memory cell array 110.

In the test mode, source voltage supplying circuit 74 receives test signals TE1 to TEn some of which have/has the L level and the other of which have the H level and test signals /TE1 to /TEn some of which have/has the H level and the other of which have at the L level from control circuit 50. Control circuit 50 outputs an inactivation signal to Vbl generating circuit 20. P-channel MOS transistor which receives the test signal TE of L level at its gate terminal and N-channel MOS transistor which receives test signal /TE of H level at its gate terminal are turned on, the other P-channel and N-channel MOS transistors are turned off. Switching circuit 742 supplies precharge voltage VblT input via pad 56 and node 743 to output not 741 via the impedance. Source voltage supplying circuit 74 supplies precharge voltage VblT via output node 741 to equalizing circuits 21 to 2m in memory cell array 110.

In the test mode, therefore, equalizing circuits 21 to 2m finish the equalizing operation before the voltage on the bit line pairs BL1 and /BL1 to BLm and /BLm reach precharge voltage VblT. As a result, the voltage difference between each of the bit line pairs BL1 and /BL1 to BLm and /BLm increases more slowly as shown in FIG. 6 in the sensing operation of sense amplifiers 31 to 3m, a memory cell having no margin is easily detected.

The data writing/reading operations in semiconductor memory device 500 in the normal operation mode or the test mode are the same as those described in the first embodiment.

At the time of shipment of semiconductor memory device 500, P-channel MOS transistors 7421 to 742n and N-channel MOS transistors 7431 to 743n constructing switching circuit 742 may be always turned on or off for the reason that precharge voltage VblT is not supplied from terminal 57 in semiconductor memory device 500 after shipment.

According to the fifth embodiment, the semiconductor memory device has the source voltage supplying circuit of supplying the precharge voltage directly to the memory cell array in the normal operation mode and supplying the precharge voltage to the memory cell array via the impedance in the test mode. Thus, a memory cell having no margin can be easily detected by a single test.

Further, in the source voltage supplying circuit, the impedance for supplying the precharge voltage can be switched in a plurality of levels, so that a test can be conducted while changing the range of a margin.

[Sixth Embodiment]

Figure 17:
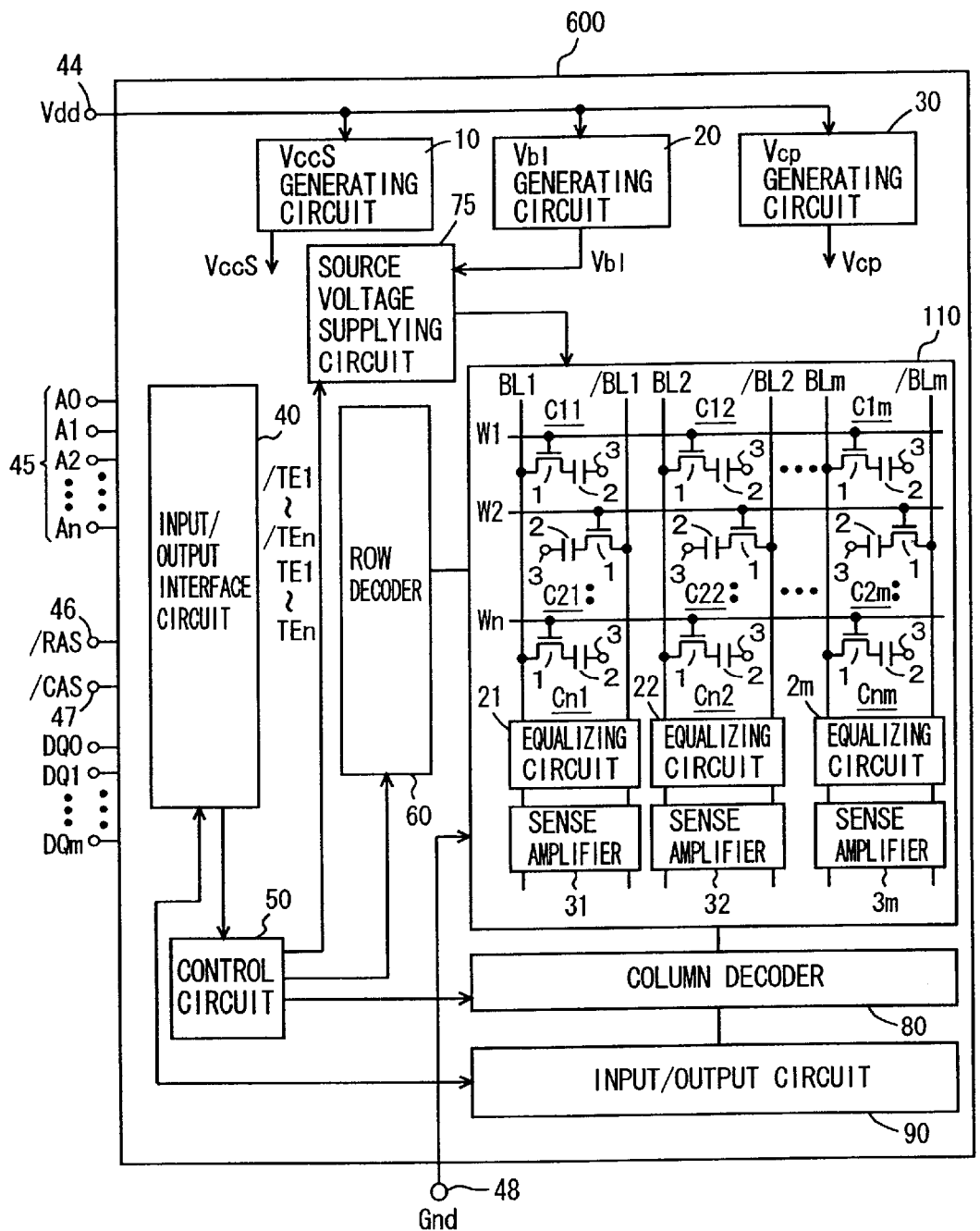
FIG. 17 is a schematic block diagram of a semiconductor memory device according to a sixth embodiment.

Referring to FIG. 17, a semiconductor memory device 600 according to a sixth embodiment is the same as semiconductor memory device 500 except that pad 56 and terminal 57 in semiconductor memory device 500 are eliminated and source voltage supplying circuit 74 is replaced by a source voltage supplying circuit 75.

In the normal operation mode, source voltage supplying circuit 75 supplies precharge voltage Vbl input from Vbl generating circuit 20 directly to equalizing circuits 21 to 2m in memory cell array 110. In the test mode, source voltage supplying circuit 75 supplies precharge voltage Vbl input from Vbl generating circuit 20 to equalizing circuits 21 to 2m in memory cell array 110 via the impedance.

Figure 18:
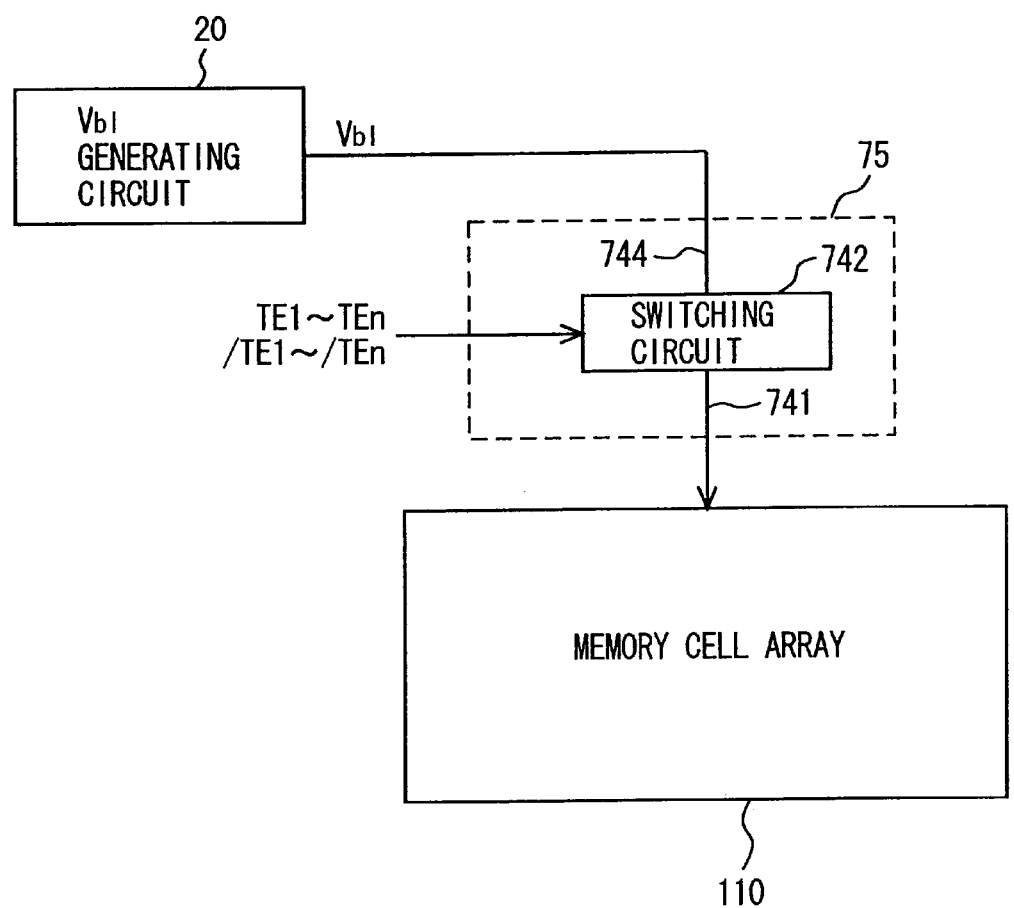
FIG. 18 is a block diagram for explaining a method of supplying a precharge voltage to a memory cell array in the sixth embodiment.

Referring to FIG. 18, source voltage supplying circuit 75 includes output node 741, switching circuit 742, and a node 744. Switching circuit 742 is connected between output node 741 and node 744. Node 744 connects Vbl generating circuit 20 to switching circuit 742.

In the normal operation mode, control circuit 50 generates test signals TE1 to TEn all of which have the L level and test signals /TE1 to /TEn all of which have the H level on the basis of address signals A0 to An, and outputs the generated test signals TE1 to TEn and /TE1 to /TEn to source voltage supplying circuit 75. In the test mode, control circuit 50 generates test signals TE1 to TEn some of which have/has the L level and the other of which have the H level and test signals /TE1 to /TEn some of which have/has the H level and the other of which have the L level on the basis of address signals A0 to An, and outputs the generated test signals TE1 to TEn and/TE1 to /TEn to source voltage supplying circuit 75.

Consequently, in the normal operation mode, when switching circuit 742 receives test signals TE1 to TEn all of which have the L level and test signals /TE1 to /TEn all of which have the H level, P-channel MOS transistors 7421 to 742n and N-channel MOS transistors 7431 to 743n are turned on. Switching circuit 742 supplies precharge voltage Vbl input from Vbl generating circuit 20 directly to equalizing circuits 21 to 2m in memory cell array via output node 741.

On the other hand, in the test mode, when switching circuit 742 receives test signals TE1 to TEn some of which have/has the L level and the other of which have the H level and test signals /TE1 to /TEn some of which have/has the H level and the other of which have the L level, P-channel MOS transistor to which the test signal TE of L level is input and N-channel MOS transistor to which the test signal /TE of H level is input are turned on, and P-channel MOS transistor which receives test signal TE of H level and N-channel MOS transistor which receives test signal /TE of L level are turned off. It makes switching circuit 742 supply precharge voltage Vbl to equalizing circuits 21 to 2m in memory cell array 110 via the impedance.

By switching the logic levels of test signals TE1 to TEn and/TE1 to /TEn in such a manner, in the test mode, a memory cell having no margin is detected.

The other detail is the same as that of semiconductor memory device 500. The data writing/reading operations in semiconductor memory device 600 in the normal operation mode or the test mode are the same as those described in the first embodiment.

At the time of shipment of semiconductor memory device 600, all P-channel MOS transistors 7421 to 742n and N-channel MOS transistors 7431 to 743n constructing switching circuit 742 are turned on.

According to the sixth embodiment, the semiconductor memory device has the source voltage supplying circuit of supplying the precharge voltage directly to the memory cell array in the normal operation mode and supplying the precharge voltage to the memory cell array via the impedance in the test mode. Thus, a memory cell having no margin can be easily detected by a single test.

Further, in the source voltage supplying circuit, the impedance for supplying the precharge voltage can be switched in a plurality of levels, so that a test can be conducted while changing the range of a margin.

[Seventh Embodiment]

Figure 19:
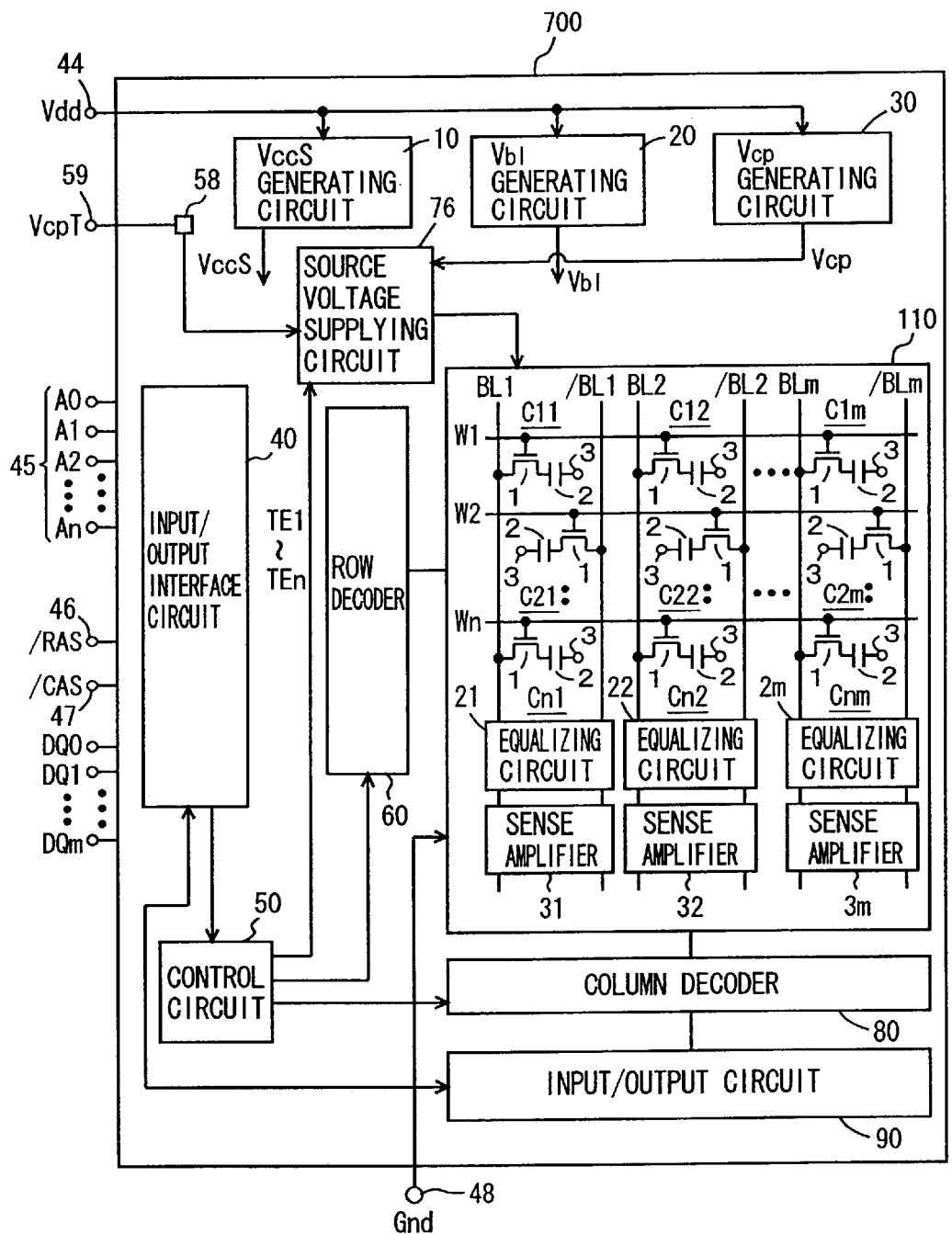
FIG. 19 is a schematic block diagram of a semiconductor memory device according to a seventh embodiment.

Referring to FIG. 19, a semiconductor memory device 700 according to a seventh embodiment is the same as semiconductor memory device 600 except that source voltage supplying circuit 75 is replaced by a source voltage supplying circuit 76 and a pad 58 and a terminal 59 are added.

In semiconductor memory device 700, Vcp generating circuit 30 outputs generated cell plate voltage Vcp to source voltage supplying circuit 76. Control circuit 50 generates test signals TE1 to TEn on the basis of address signals A0 to An, and outputs the generated test signals TE1 to TEn to source voltage supplying circuit 76. Pad 58 supplies cell plate voltage VcpT input from terminal 59 to source voltage supplying circuit 76. Cell plate voltage VcpT is a cell plate voltage supplied in the test mode.

Figure 20:
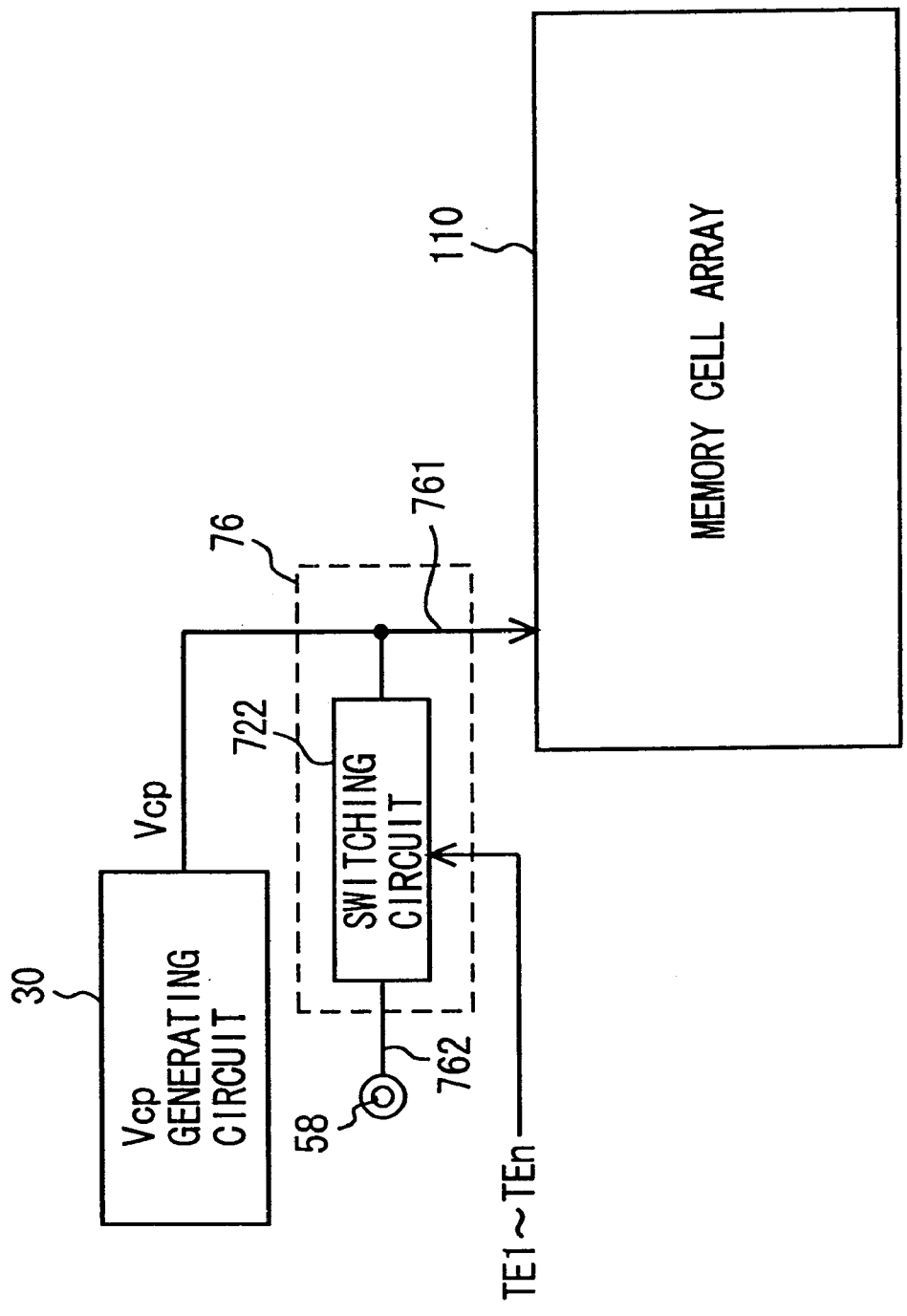
FIG. 20 is a block diagram for explaining a method of supplying a cell plate voltage to a memory cell array in the seventh embodiment.

Referring to FIG. 20, source voltage supplying circuit 76 includes an output node 761, switching circuit 722, and a node 762. Output node 761 is connected to Vcp generating circuit 30. Switching circuit 722 is connected between output node 761 and node 762. Node 762 connects pad 58 to switching circuit 722.

Switching circuit 722 is as described above (refer to FIG. 11).

When test signal TE1 of the L level and test signals TE2 to TEn of the H level are input from control circuit 50 to switching circuit 722, therefore, P-channel MOS transistor 7221 is turned on and P-channel MOS transistors 7222 to 722n are turned off. Switching circuit 722 supplies cell plate voltage VcpT input from node 762 to output node 761 via P-channel MOS transistor 7221. That is, switching circuit 722 supplies cell plate voltage VcpT to output node 761 via the impedance.

When test signals TE1 to TEn all of which have the L level are input from control circuit 50, all P-channel MOS transistors 7221 to 722n are turned on, so that switching circuit 722 supplies cell plate voltage VcpT input from node 762 directly to output node 761. Further, when test signals TE1 to TEn some of which have/has the L level and the other have the H level are input from control circuit 50, P-channel MOS transistor which receives the test signal of L level is turned on and P-channel MOS transistor which receives the test signal of H level is turned off. Consequently, switching circuit 722 supplies cell plate voltage VcpT input from node 762 to output node 761 while changing the impedance. In such a manner, switching circuit 722 supplies cell plate voltage VcpT input from node 762 to output node 761 while changing the impedance in response to the logic levels of test signals TE1 to TEn input from control circuit 50.

In the normal operation mode, since cell plate voltage VcpT is not supplied from terminal 59, source voltage supplying circuit 76 supplies cell plate voltage Vcp from Vcp generating circuit 30 directly to terminals 3 in memory cells C11 to C1m, . . . , and Cn1 to Cnm included in memory cell array 110 via output node 761.

On the other hand, in the test mode, control circuit 50 outputs an inactivation signal to Vcp generating circuit 30 and Vcp generating circuit 30 does not therefore generate cell plate voltage Vcp. Cell plate voltage VcpT is supplied from terminal 59. Further, control circuit 50 generates test signals TE1 to TEn some of which have/has the L level and the other of which have the H level and outputs the generated test signals TE1 to TEn to source voltage supplying circuit 76. Switching circuit 722 outputs cell plate voltage VcpT input via pad 58 and node 762 to output node 761 via the impedance. Source voltage supplying circuit 76 supplies cell plate voltage VcpT to terminals 3 of memory cells C11 to C1m, . . . , and Cn1 to Cnm included in memory cell array 110 via output node 761.

Accordingly, in the normal operation mode, sense amplifiers 31 to 3m perform the normal sensing operation and, in the test mode, sense amplifiers 31 to 3m perform the sensing operation such that the voltage difference between bit line pairs BL1 and /BL1 to BLm and /BLm increases more slowly, that is, the sensing operation shown in FIG. 6. Sense amplifiers 31 to 3m perform the sensing operation that the voltage difference between bit line pairs BL1 and /BL1 to BLm and /BLm increases more slowly for the reason that, when cell plate voltage Vcp is supplied to terminal 3 via the impedance, a data writing operation is finished before carries are sufficiently supplied from terminals 3 to the cell plate electrode of memory cells C11 to C1m, . . . , and Cn1 to Cnm, and carries to be injected from any of bit line pairs BL1 to BLm or bit lines /BL1 and /BLm to memory cells C11 to C1m, . . . , and Cn1 to Cnm decrease.

In the test mode, therefore, by supplying cell plate voltage VcpT to terminals 3 in memory cells C11 to C1m, ..., and Cn1 to Cnm via the impedance, a memory cell having no margin is easily detected.

At the time of shipment of semiconductor memory device 700, P-channel MOS transistors 7221 to 722n constructing switching circuit 722 may be always turned on or off for the reason that cell plate voltage VcpT is not supplied from terminal 59 after shipment.

The data writing/reading operations in semiconductor memory device 700 in the normal operation mode or test mode are the same as those described in the first embodiment.

According to the seventh embodiment, the semiconductor memory device has the source voltage supplying circuit of supplying the cell plate voltage directly to the memory cell array in the normal operation mode and supplying the cell plate voltage to the memory cell array via the impedance in the test mode. Thus, a memory cell having no margin can be easily detected by a single test.

Further, in the source voltage supplying circuit, the impedance for supplying the cell plate voltage can be switched in a plurality of levels, so that a test can be conducted while changing the range of a margin.

[Eighth Embodiment]

Figure 21:
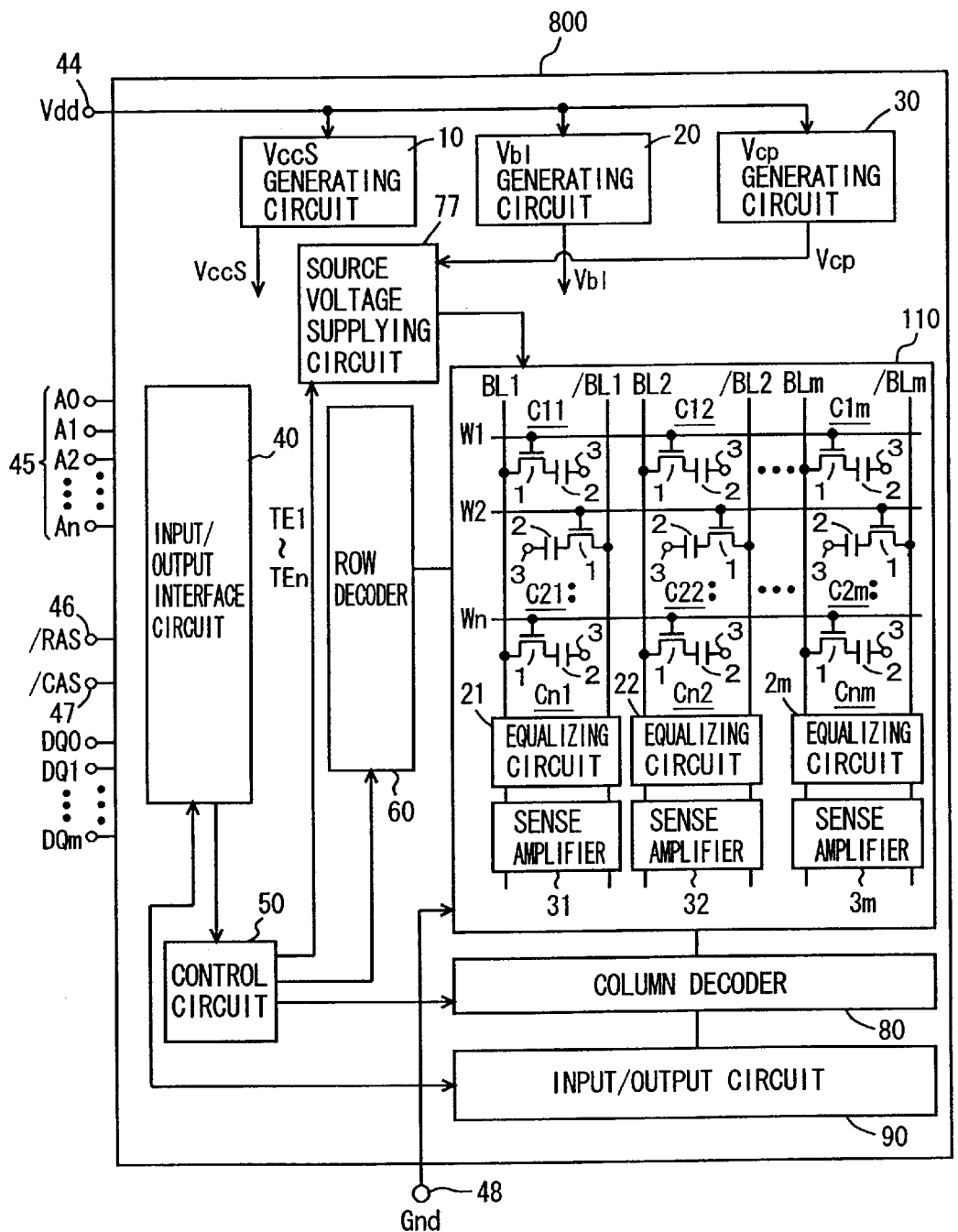
FIG. 21 is a schematic block diagram of a semiconductor memory device according to an eighth embodiment.

Referring to FIG. 21, a semiconductor memory device 800 according to an eighth embodiment is the same as semiconductor memory device 700 except that pad 58 and terminal 59 in semiconductor memory device 700 are eliminated and source voltage supplying circuit 76 is replaced by a source voltage supplying circuit 77.

In the normal operation mode, source voltage supplying circuit 77 supplies cell plate voltage Vcp input from Vcp generating circuit 30 directly to terminals 3 in memory cells C11 to C1m, ..., and Cn1 to Cnm included in memory cell array 110. In the test mode, source voltage supplying circuit 77 supplies cell plate voltage Vcp input from Vcp generating circuit 30 to terminals 3 in memory cells C11 to C1m, ..., and Cn1 to Cnm via the impedance.

Figure 22:
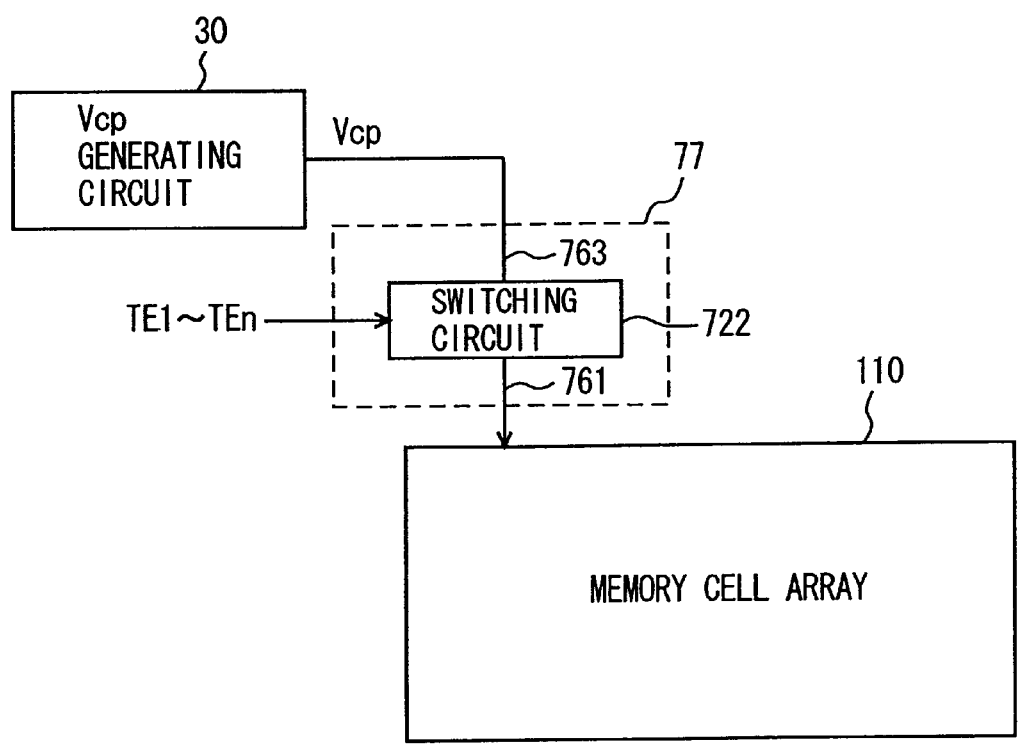
FIG. 22 is a block diagram for explaining a method of supplying a cell plate voltage to a memory cell array in the eighth embodiment.
Figure 23:
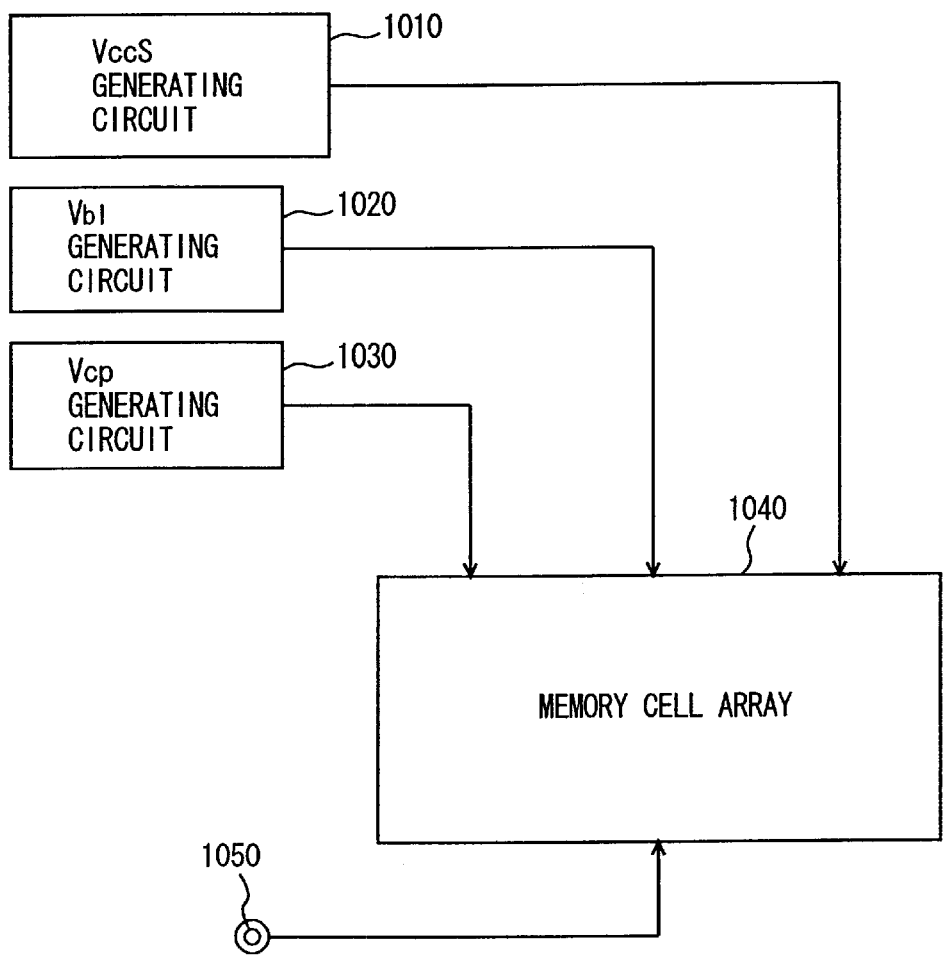
FIG. 23 is a schematic block diagram of a conventional semiconductor memory device.
Figure 24:
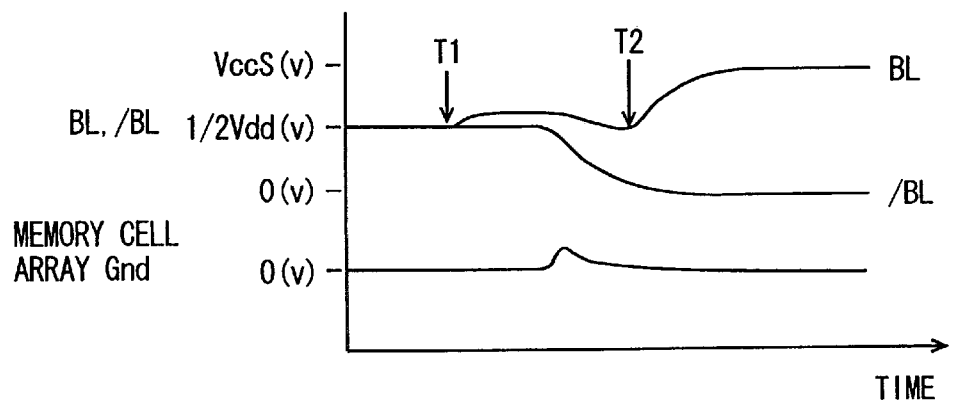
FIG. 24 is a timing chart of read data in the conventional semiconductor memory device.

Referring to FIG. 22, source voltage supplying circuit 77 includes output node 761, switching circuit 722, and a node 763. Switching circuit 722 is connected between output node 761 and node 763. Node 763 connects Vcp generating circuit 30 to switching circuit 722.

In the normal operation mode, control circuit 50 generates test signals TE1 to TEn all of which have the L level on the basis of address signals A0 to An, and outputs the generated test signals TE1 to TEn to source voltage supplying circuit 77. In the test mode, control circuit 50 generates test signals TE1 to TEn some of which have/has the L level and the other of which have the H level on the basis of address signals A0 to An, and outputs the generated test signals TE1 to TEn to source voltage supplying circuit 77.

Consequently, in the normal operation mode, when switching circuit 722 receives test signals TE1 to TEn all of which have the L level, P-channel MOS transistors 7221 to 722n are turned on. Switching circuit 722 supplies cell plate voltage Vcp input from Vcp generating circuit 30 directly to terminals 3 in memory cells C11 to C1m, ..., and Cn1 to Cnm via output node 761.

In the test mode, when switching circuit 722 receives test signals TE1 to TEn some of which have/has the L level and the other of which have the H level, P-channel MOS transistor which receives the test signal of L level is turned on and P-channel MOS transistor which receives the test signal of H level is turned off. It makes switching circuit 722 supply cell plate voltage Vcp to terminals 3 in memory cells C11 to C1m, ..., and Cn1 to Cnm via the impedance.

By switching the logic levels of test signals TE1 to TEn in such a manner, in the test mode, a memory cell having no margin is detected.

The other detail is the same as that of semiconductor memory device 700. The data writing/reading operations in semiconductor memory device 800 in the normal operation mode or the test mode are the same as those described in the first embodiment.

At the time of shipment of semiconductor memory device 800, all P-channel MOS transistors 7221 to 722n constructing switching circuit 722 are turned on.

According to the eighth embodiment, the semiconductor memory device has the source voltage supplying circuit of supplying the cell plate voltage directly to the memory cell array in the normal operation mode and supplying the cell plate voltage to the memory cell array via the impedance in the test mode. Thus, a memory cell having no margin can be easily detected by a single test.

Further, in the source voltage supplying circuit, the impedance for supplying the cell plate voltage can be switched in a plurality of levels, so that a test can be conducted while changing the range of a margin.

Although the detection of a memory cell having no margin in a DRAM has been described above, the invention is not limited to a DRAM but the first to sixth embodiments can be also applied to detection of a memory cell having no margin in an SRAM or flash memory.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a memory cell array for inputting/outputting data; and a source voltage supplying circuit for supplying an internal source voltage for performing a sensing operation of amplifying read data read from a memory cell included in said memory cell array in response to a logic level of said read data, said memory cell array includes:
        a plurality of memory cells;
        a plurality of bit line pairs provided in correspondence with said plurality of memory cells;
        a plurality of equalizing circuits provided in correspondence with said plurality of bit line pairs, for equalizing said bit line pair to a precharge voltage; and
        a plurality of sense amplifiers provided in correspondence with said plurality of bit line pairs, for increasing a voltage on one of bit lines of said bit line pair to a memory array voltage and decreasing a voltage on the other of said bit line pair to a ground voltage in response to the logic level of said read data in said sensing operation, wherein in a normal operation mode, said source voltage supplying circuit supplies said internal source voltage directly to said memory cell array and, in a test mode, said source voltage supplying circuit supplies said internal source voltage to said memory cell array via an impedance.

2. The semiconductor memory device according to claim 1, wherein said internal source voltage is a ground voltage, and said source voltage supplying circuit supplies said ground voltage to each of said plurality of sense amplifiers.

3. The semiconductor memory device according to claim 2, further comprising:
- a test signal generating circuit for generating a test signal having either a first logic level or a second logic level; and
- a pad to which said ground voltage is supplied,
- wherein said source voltage supplying circuit includes:
  - an output node for supplying said ground voltage to said sense amplifier; and
  - a ground voltage supplying circuit for supplying said ground voltage directly to said output node on receipt of a test signal having said first logic level, and for supplying said ground voltage to said output node via said impedance on receipt of a test signal having said second logic level.

4. The semiconductor memory device according to claim 3, wherein said pad includes:
- a first pad to which said ground voltage is supplied in said normal operation mode; and
- a second pad to which said ground voltage is supplied in said test mode,
- said output node is connected to said first pad,
- said ground voltage supplying circuit includes a plurality of MOS transistors connected in parallel between said output node and said second pad,
- each of said plurality of MOS transistors is turned off when the test signal having said first logic level is received at its gate terminal and is turned on when the test signal having said second logic level is received at its gate terminal, and
- in said test mode, said test signal generating circuit outputs the test signal having said second logic level to a predetermined number of MOS transistors among said plurality of MOS transistors and outputs the test signal having said first logic level to the rest of MOS transistors.

5. The semiconductor memory device according to claim 3, wherein said ground voltage supplying circuit includes a plurality of MOS transistors connected in parallel between said output node and said pad,
- each of said plurality of MOS transistors is turned off when the test signal having said first logic level is received at its gate terminal and is turned on when the test signal having said second logic level is received at its gate terminal,
- in said test mode, said test signal generating circuit outputs the test signal having said second logic level to a predetermined number of MOS transistors among said plurality of MOS transistors and outputs the test signal having said first logic level to the rest of MOS transistors, and in said normal operation mode, said test signal generating circuit outputs the test signal having said second logic level to said plurality of MOS transistors.

6. The semiconductor memory device according to claim 1, wherein said internal source voltage is said memory array voltage, and
- said source voltage supplying circuit supplies said memory array voltage to each of said plurality of sense amplifiers.

7. The semiconductor memory device according to claim 6, further comprising a test signal generating circuit for generating a test signal having either a first logic level or a second logic level,
- wherein said source voltage supplying circuit includes:
  - an output node for supplying said memory array voltage to said sense amplifier; and
  - a voltage supplying circuit for supplying said memory array voltage directly to said output node on receipt of a test signal having said first logic level, and for supplying said memory array voltage to said output node via said impedance on receipt of a test signal having said second logic level.

8. The semiconductor memory device according to claim 7, further comprising:
- an internal voltage generating circuit for generating said memory array voltage in said normal operation mode; and
- a pad to which said memory array voltage is supplied in said test mode,
- wherein said output node is connected to said internal voltage generating circuit,
- said voltage supplying circuit includes a plurality of MOS transistors connected in parallel between said output node and said pad,
- each of said plurality of MOS transistors is turned off when the test signal having said first logic level is received at its gate terminal and is turned on when the test signal having said second logic level is received at its gate terminal, and
- in said test mode, said test signal generating circuit outputs the test signal having said second logic level to a predetermined number of MOS transistors among said plurality of MOS transistors and outputs the test signal having said first logic level to the rest of MOS transistors.

9. The semiconductor memory device according to claim 7, further comprising an internal voltage generating circuit for generating said memory array voltage,
- wherein said voltage supplying circuit includes a plurality of MOS transistors connected in parallel between said output node and said internal voltage generating circuit,
- each of said plurality of MOS transistors is turned off when the test signal having said first logic level is received at its gate terminal and is turned on when the test signal having said second logic level is received at its gate terminal,
- in said test mode, said test signal generating circuit outputs the test signal having said second logic level to a predetermined number of MOS transistors among said plurality of MOS transistors and outputs the test signal having said first logic level to the rest of MOS transistors, and in said normal operation mode, said test signal generating circuit outputs the test signal having said second logic level to said plurality of MOS transistors.

10. The semiconductor memory device according to claim 1, wherein said internal source voltage is said precharge voltage, and
- said source voltage supplying circuit supplies said precharge voltage to each of said plurality of equalizing circuits.

11. The semiconductor memory device according to claim 10, further comprising a test signal generating circuit for generating a test signal having either a first logic level or a second logic level,
- wherein said source voltage supplying circuit includes:
  - an output node for supplying said precharge voltage to said equalizing circuit; and a voltage supplying circuit for supplying said precharge voltage directly to said output node on receipt of a test signal having said first logic level, and for supplying said precharge voltage to said output node via said impedance on receipt of a test signal having said second logic level.

12. The semiconductor memory device according to claim 11, further comprising:
an internal voltage generating circuit for generating said precharge voltage in said normal operation mode; and
a pad to which said precharge voltage is supplied in said test mode,
wherein said output node is connected to said internal voltage generating circuit,
said voltage supplying circuit includes:
a plurality of MOS transistors of a first conductive type connected in parallel between said output node and said pad; and
a plurality of MOS transistors of a second conductive type connected in parallel between said output node and said pad,
each of said plurality of MOS transistors of the first conductive type is turned off when the test signal having said first logic level is received at its gate terminal and is turned on when the test signal having said second logic level is received at its gate terminal, and
each of said plurality of MOS transistors of the second conductive type is turned on when the test signal having said first logic level is received at its gate terminal and is turned off when the test signal having said second logic level is received at its gate terminal,
in said test mode, said test signal generating circuit outputs the test signal having said second logic level to a predetermined number of MOS transistors among said plurality of MOS transistors of the first conductive type, outputs the test signal having said first logic level to the rest of MOS transistors,
outputs the test signal having said first logic level to a predetermined number of MOS transistors among said plurality of MOS transistors of the second conductive type, and outputs the test signal having said second logic level to the rest of MOS transistors.

13. The semiconductor memory device according to claim 11, further comprising an internal voltage generating circuit for generating said precharge voltage,
wherein said voltage supplying circuit includes:
a plurality of MOS transistors of a first conductive type connected in parallel between said output node and said internal voltage generating circuit; and
a plurality of MOS transistors of a second conductive type connected in parallel between said output node and said internal voltage generating circuit,
each of said plurality of MOS transistors of the first conductive type is turned off when the test signal having said first logic level is received at its gate terminal and is turned on when the test signal having said second logic level is received at its gate terminal,
each of said plurality of MOS transistors of the second conductive type is turned on when the test signal having said first logic level is received at its gate terminal and is turned off when the test signal having said second logic level is received at its gate terminal,
in said test mode, said test signal generating circuit outputs the test signal having said second logic level to a predetermined number of MOS transistors among said plurality of MOS transistors of the first conductive type, outputs the test signal having said first logic level to the rest of MOS transistors,
outputs the test signal having said first logic level to a predetermined number of MOS transistors out of said plurality of MOS transistors of the second conductive type, and outputs the test signal having said second logic level to the rest of MOS transistors, and
in said normal operation mode, said test signal generating circuit outputs the test signal having said second logic level to said plurality of MOS transistors of said first conductive type, and outputs the test signal having said first logic level to said plurality of MOS transistors of the second conductive type.

14. The semiconductor memory device according to claim 1, wherein said internal source voltage is a cell plate voltage for storing said data into said memory cell, and
said source voltage supplying circuit supplies said cell plate voltage to a cell plate electrode in said memory cell.

15. The semiconductor memory device according to claim 14, further comprising a test signal generating circuit for generating a test signal having either a first logic level or a second logic level,
wherein said source voltage supplying circuit includes:
an output node for supplying said cell plate voltage to said cell plate electrode; and
a voltage supplying circuit for supplying said cell plate voltage directly to said output node on receipt of a test signal having said first logic level, and for supplying said cell plate voltage to said output node via said impedance on receipt of a test signal having said second logic level.

16. The semiconductor memory device according to claim 15, further comprising:
an internal voltage generating circuit for generating said cell plate voltage in said normal operation mode; and
a pad to which said cell plate voltage is supplied in said test mode,
wherein said output node is connected to said internal voltage generating circuit,
said voltage supplying circuit includes:
a plurality of MOS transistors of a first conductive type connected in parallel between said output node and said pad; and
a plurality of MOS transistors of a second conductive type connected in parallel between said output node and said pad,
each of said plurality of MOS transistors of the first conductive type is turned off when the test signal having said first logic level is received at its gate terminal, and is turned on when the test signal having said second logic level is received at its gate terminal, and
each of said plurality of MOS transistors of the second conductive type is turned on when the test signal having said first logic level is received at its gate terminal, and is turned off when the test signal having said second logic level is received at its gate terminal,
in said test mode, said test signal generating circuit outputs the test signal having said second logic level to a predetermined number of MOS transistors amomg said plurality of MOS transistors of the first conductive type, outputs the test signal having said first logic level to the rest of MOS transistors, outputs the test signal having said first logic level to a predetermined number of MOS transistors among said plurality of MOS transistors of the second conductive type, and outputs the test signal having said second logic level to the rest of MOS transistors.

17. The semiconductor memory device according to claim 15, further comprising an internal voltage generating circuit for generating said cell plate voltage, wherein said voltage supplying circuit includes:
- a plurality of MOS transistors of a first conductive type connected in parallel between said output node and said internal voltage generating circuit; and
- a plurality of MOS transistors of a second conductive type connected in parallel between said output node and said internal voltage generating circuit, each of said plurality of MOS transistors of the first conductive type is turned off when the test signal having said first logic level is received at its gate terminal, and is turned on when the test signal having said second logic level is received at its gate terminal, each of said plurality of MOS transistors of the second conductive type is turned on when the test signal having said first logic level is received at its gate terminal and is turned off when the test signal having said second logic level is received at its gate terminal, in said test mode, said test signal generating circuit outputs the test signal having said second logic level to a predetermined number of MOS transistors among said plurality of MOS transistors of the first conductive type, outputs the test signal having said first logic level to the rest of MOS transistors, outputs the test signal having said first logic level to a predetermined number of MOS transistors among said plurality of MOS transistors of the second conductive type, and outputs the test signal having said second logic level to the rest of MOS transistors, and in said normal operation mode, said test signal generating circuit outputs the test signal having said second logic level to said plurality of MOS transistors of said first conductive type, and outputs the test signal having said first logic level to said plurality of MOS transistors of the second conductive type.

* * * * *